US009225149B2

(12) United States Patent
Suzuki et al.

(10) Patent No.: US 9,225,149 B2
(45) Date of Patent: Dec. 29, 2015

(54) SURFACE EMITTING LASER ELEMENT AND ATOMIC OSCILLATOR

(71) Applicants: Ryoichiro Suzuki, Miyagi (JP); Shunichi Sato, Miyagi (JP)

(72) Inventors: Ryoichiro Suzuki, Miyagi (JP); Shunichi Sato, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/289,792

(22) Filed: May 29, 2014

(65) Prior Publication Data

US 2014/0354366 A1    Dec. 4, 2014

(30) Foreign Application Priority Data

May 31, 2013   (JP) ................................. 2013-114881
Mar. 13, 2014   (JP) ................................. 2014-050392

(51) Int. Cl.
    *G04F 5/14*            (2006.01)
    *H01S 5/183*          (2006.01)
    (Continued)

(52) U.S. Cl.
    CPC ............... *H01S 5/423* (2013.01); *H01S 5/0421* (2013.01); *H01S 5/187* (2013.01);
    (Continued)

(58) Field of Classification Search
    CPC ............. G04F 5/15; G04F 5/145; H01S 1/06; H01S 5/18; H01S 5/183; H01S 5/18313; H01S 5/18327; H01S 5/1833; H01S 5/18344; H01S 5/18347; H01S 5/18369; H01S 5/187; H01S 5/30; H01S 5/3013; H01S 5/323; H01S 5/40; H01S 5/42; H01S 5/423; H01S 5/426; H03B 17/00; H03L 7/26
    USPC ...................... 331/3, 94.1; 372/50.11, 50.124
    See application file for complete search history.

(56) References Cited

U.S. PATENT DOCUMENTS 5,216,686 A * 6/1993 Holm et al. ................. 372/45.01
5,493,577 A * 2/1996 Choquette et al. ....... 372/46.013
(Continued)

FOREIGN PATENT DOCUMENTS

EP    2690725 A2    1/2014
JP    2751814    5/1998
(Continued)

OTHER PUBLICATIONS

Jean-Francois P. Seurin et al., "Modal competition in implant-apertured index-guided vertical-cavity surface-emitting lasers", Applied Physics Letters, vol. 77, pp. 3686-3688 (2000).
(Continued)

*Primary Examiner* — Levi Gannon
(74) *Attorney, Agent, or Firm* — Cooper & Dunham LLP

(57) ABSTRACT

A surface emitting laser element includes plural surface emitting lasers provided on a substrate. Each of the plural surface emitting lasers includes a first reflection mirror provided on the substrate; an active layer provided on the first reflection mirror; a wavelength adjustment region provided on the active layer; and a second reflection mirror provided on the wavelength adjustment region. The wavelength adjustment region includes a phase adjustment layer and a wavelength adjustment layer provided on the phase adjustment layer. A thickness of the wavelength adjustment region is approximately an odd multiple of a wavelength of emitted light divided by four. A thickness of the phase adjustment layer is approximately an even multiple of the wavelength of the emitted light divided by four. A thickness of the wavelength adjustment layer is different from a thickness of a wavelength adjustment layer of at least one of the other surface emitting lasers.

17 Claims, 17 Drawing Sheets

(51) Int. Cl.
*H01S 5/187* (2006.01)
*H01S 5/323* (2006.01)
*H01S 5/42* (2006.01)
*H03L 7/26* (2006.01)
*H01S 5/40* (2006.01)
*H01S 5/30* (2006.01)
*H01S 5/042* (2006.01)
*H01S 5/026* (2006.01)
*H01S 5/343* (2006.01)
*H01S 5/20* (2006.01)

(52) U.S. Cl.
CPC ........ *H01S 5/18347* (2013.01); *H01S 5/18358* (2013.01); *H01S 5/3013* (2013.01); *H01S 5/323* (2013.01); *H01S 5/4087* (2013.01); *H03L 7/26* (2013.01); *G04F 5/145* (2013.01); *H01S 5/026* (2013.01); *H01S 5/18311* (2013.01); *H01S 5/18341* (2013.01); *H01S 5/18344* (2013.01); *H01S 5/18369* (2013.01); *H01S 5/2086* (2013.01); *H01S 5/34313* (2013.01); *H01S 5/34373* (2013.01); *H01S 2301/166* (2013.01); *H01S 2301/176* (2013.01)

(56) References Cited

U.S. PATENT DOCUMENTS

| | | | |
|---|---|---|---|
| 6,195,485 | B1 | 2/2001 | Coldren et al. |
| 6,259,121 | B1 | 7/2001 | Lemoff et al. |
| 6,566,688 | B1* | 5/2003 | Zhang et al. .................... 257/85 |
| 7,453,096 | B2* | 11/2008 | Takahashi et al. ............... 257/87 |
| 7,590,159 | B2* | 9/2009 | Jikutani et al. .............. 372/50.11 |
| 8,279,519 | B2* | 10/2012 | Takahashi et al. ............ 359/344 |
| 8,705,585 | B2 | 4/2014 | Sato et al. |
| 8,971,372 | B2* | 3/2015 | Suzuki et al. ............. 372/50.124 |
| 2001/0050934 | A1* | 12/2001 | Choquette et al. .............. 372/43 |
| 2002/0085610 | A1* | 7/2002 | Morgan et al. ................... 372/99 |
| 2005/0147143 | A1* | 7/2005 | Jikutani ......................... 372/43 |
| 2013/0070039 | A1* | 3/2013 | Harasaka et al. ............. 347/224 |
| 2013/0335155 | A1 | 12/2013 | Sato |
| 2014/0023104 | A1 | 1/2014 | Suzuki et al. |
| 2014/0133510 | A1 | 5/2014 | Sato |

FOREIGN PATENT DOCUMENTS

| | | |
|---|---|---|
| JP | 11-330631 | 11/1999 |
| JP | 2000-058958 | 2/2000 |
| JP | 2008-053353 | 3/2008 |
| JP | 2008-283129 | 11/2008 |
| JP | 2009-188598 | 8/2009 |
| WO | WO2013/005813 A1 | 1/2013 |
| WO | 2013/081176 A1 | 6/2013 |
| WO | WO2013/081176 A1 | 6/2013 |

OTHER PUBLICATIONS

Padullaparthi Babu Dayal et al., "Multiple-Wavelength Vertical-Cavity Surface-Emitting Lasers by Grading a Spacer Layer for Short-Reach Wavelength Division Multiplexing Applications", Applied Physics Express 2, 092501 (2009).

Svenja Knappe et al., "A microfabricated atomic clock", Applied Physics Letters, vol. 85, pp. 1460-1462 (2004).

Svenja Knappe, "MEMS Atomic Clocks", Comprehensive Microsystems, vol. 3, pp. 571-612 (2007).

Darwin K. Serkland et al., "VCSELs for Atomic Clocks", Proc. of SPIE, vol. 6132, 613208 (2006).

U.S. Appl. No. 14/069,541, filed Nov. 1, 2013.

Apr. 17, 2015 European official action dated in corresponding European Patent Application No. 14 17 0377.

Wupen Yuen et al. "Multiple-Wavelength Vertical-Cavity Surface-Emitting Laser Arrays with a Recorded Wavelength Span", IEEE Photonics Technology Letters, vol. 8, No. 1, Jan. 1, 1996, pp. 4-6.

\* cited by examiner

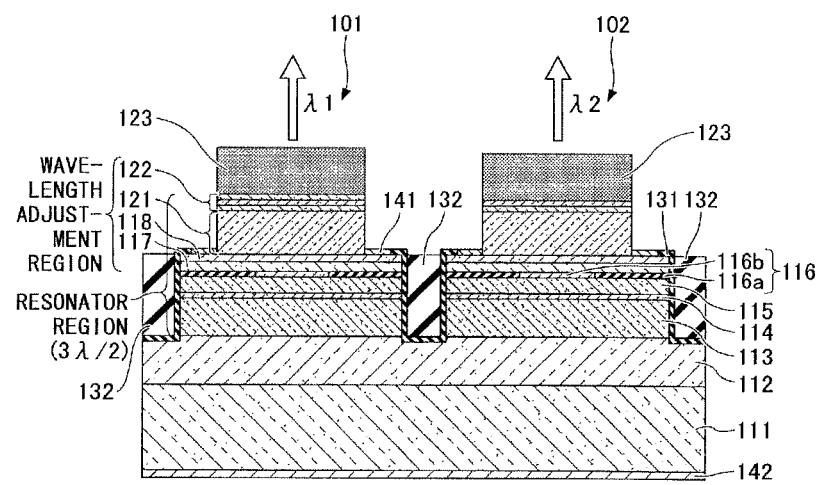
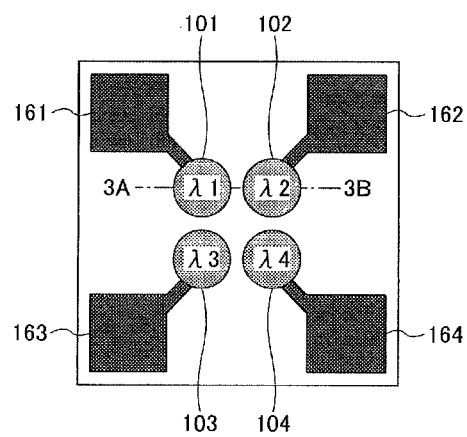

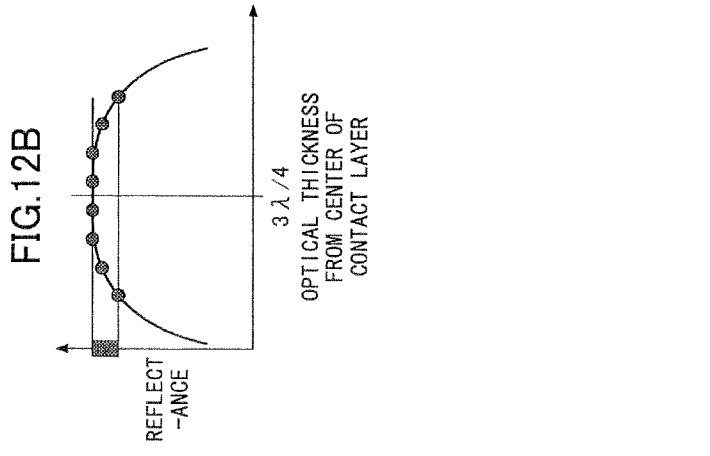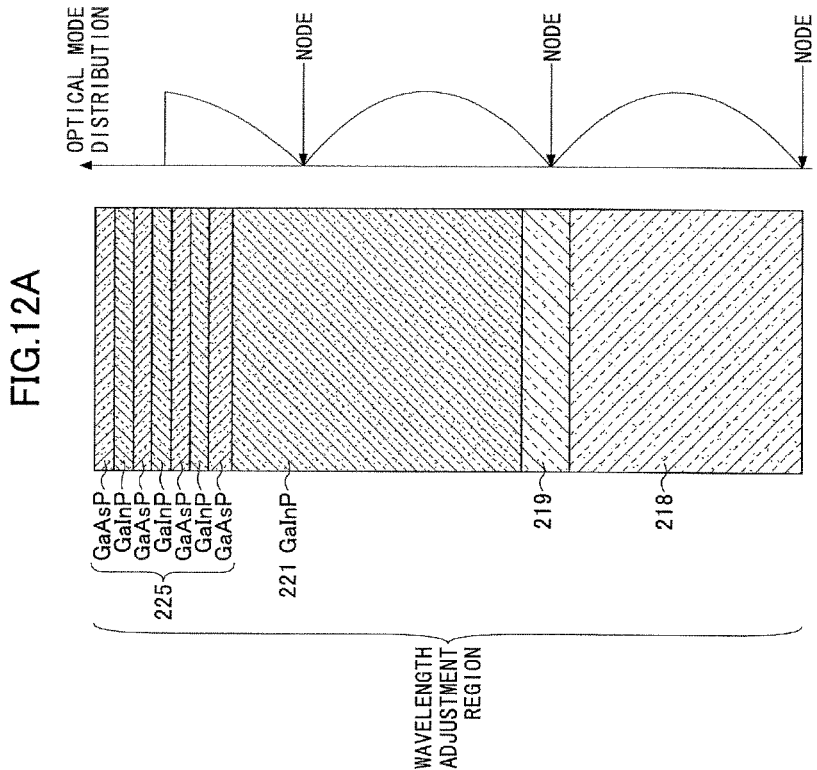

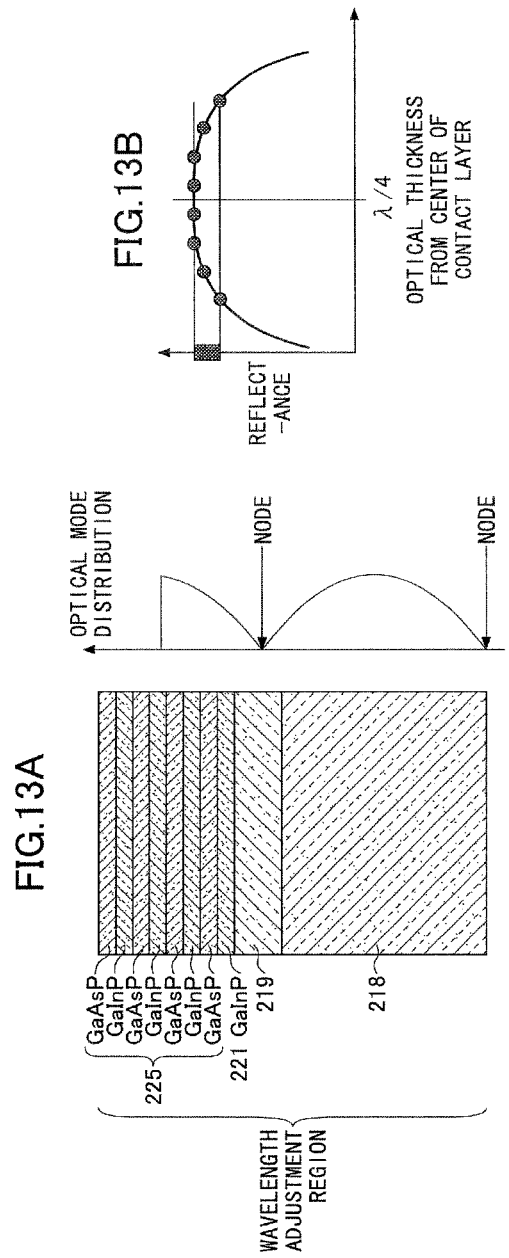

SURFACE EMITTING LASER ELEMENT AND ATOMIC OSCILLATOR

BACKGROUND OF THE INVENTION

1. Field of the Invention

The disclosures herein generally relate to a surface emitting laser element and an atomic oscillator.

2. Description of the Related Art

A vertical cavity surface emitting LASER (VCSEL) is a semiconductor laser, which emits light in a direction perpendicular to a substrate surface. The VCSEL has a feature, compared with an end-face emitting type semiconductor laser, of low cost, low power consumption, small size, high performance, and being easy to be integrated two-dimensionally.

The vertical cavity surface emitting laser has a resonator structure that has a resonator region including an active layer, and upper and lower Bragg reflection mirrors provided above and below the resonator region, respectively (See Japanese Published Patent Application No. 2008-53353). The resonator region has a predetermined optical thickness so that light with wavelength of λ resonates in the resonator region in order to obtain light with an oscillation wavelength of λ. The upper and lower Bragg reflection mirrors are formed by DBRs (Distributed Bragg Reflector) formed by laminating materials having different refraction indices, i.e. a low refraction index material and a high refraction index material, alternately. In the DBR, the low and high refraction index materials are formed so that optical thicknesses are λ/4 taking account of the refraction indices of the respective materials, in order to obtain high reflectance where the wavelength is λ.

Moreover, Japanese Patent No. 2751814, Japanese Published Patent Application No. 2000-58958, Japanese Published Patent Application No. H11-330631, and Japanese Published Patent Application No. 2008-283129 disclose a multi-wavelength surface emitting laser element in which plural surface emitting lasers with different wavelengths are formed in one chip. The multi-wavelength surface emitting laser element is expected to be widely used for multi-wavelength communication and the like. As a method of obtaining such a multi-wavelength surface emitting laser element, Japanese Patent No. 2751814 discloses laminating alternately two kinds of material, which are etched by different kinds of etching liquid, on the oscillator region of the surface emitting laser element to form a wavelength adjustment region, and removing one layer for each of surface emitting lasers with different wavelengths by wet etching, thereby changing a layer thickness of the wavelength adjustment region, and the optical thickness in the resonator region is changed for each surface emitting laser. This method is preferable from a viewpoint of controllability of wavelength of laser light emitted from the surface emitting laser and from a viewpoint of productivity.

Japanese Patent No. 2751814 describes performing wet etching in the wavelength adjustment region of semiconductor for one layer for each of surface emitting lasers with different wavelengths, and forming a semiconductor layer by a recrystal growth or the like, to form a reflection mirror above the wavelength adjustment region. However, in the case of forming a semiconductor layer by the recrystal growth on a surface etched by wet etching, high reliability cannot be obtained.

Moreover, Japanese Patent No. 2751814 or the like describes a structure in which an electric current passes through the wavelength adjustment region formed by the semiconductor layer, and electric resistance increases due to band discontinuities on interfaces between layers of different semiconductor materials in the wavelength adjustment region. Moreover, according to the wet etching for one layer, variation in electric resistance or the like may occur for each of the surface emitting lasers with different wavelengths.

Accordingly, a surface emitting laser element on which plural surface emitting lasers for emitting laser light with different wavelengths are formed and in which electric characteristics or the like of the respective surface emitting lasers are uniform is desired.

SUMMARY OF THE INVENTION

It is a general object of at least one embodiment of the present invention to provide a surface emitting laser element and an atomic oscillator that substantially obviate one or more problems caused by the limitations and disadvantages of the related art.

In one embodiment, a surface emitting laser element includes plural surface emitting lasers provided on a substrate. Each of the plural surface emitting lasers includes a first reflection mirror provided on the substrate; an active layer provided on the first reflection mirror; a wavelength adjustment region provided on the active layer; and a second reflection mirror provided on the wavelength adjustment region. The wavelength adjustment region includes a phase adjustment layer and a wavelength adjustment layer provided on the phase adjustment Layer. A thickness of the wavelength adjustment region is approximately a positive odd multiple of a wavelength of emitted light divided by four. A thickness of the phase adjustment layer is approximately a positive even multiple of the wavelength of the emitted light divided by four. A thickness of the wavelength adjustment layer is different from a thickness of a wavelength adjustment layer of at least one of the other surface emitting lasers.

In another embodiment, an atomic oscillator includes a surface emitting laser element including plural surface emitting lasers provided on a substrate; an alkali metal cell that encapsulates alkali metal; and a light detection unit that detects light transmitted through the alkali metal cell, the light being emitted from a surface emitting laser of the surface emitting laser element. The surface emitting laser includes a first reflection mirror provided on the substrate; an active layer provided on the first reflection mirror; a wavelength adjustment region provided on the active layer; and a second reflection mirror provided on the wavelength adjustment region. The wavelength adjustment region includes a phase adjustment layer and a wavelength adjustment layer provided on the phase adjustment layer. A thickness of the wavelength adjustment region is approximately a positive odd multiple of a wavelength of emitted light divided by four. A thickness of the phase adjustment layer is approximately a positive even multiple of the wavelength of the emitted light divided by four. A thickness of the wavelength adjustment layer is different from a thickness of a wavelength adjustment layer of at least one of the other surface emitting lasers. An oscillation frequency is controlled according to a light absorption characteristic of a quantum interference effect for two kinds of resonant lights, by injecting lights with two different wavelengths out of lights including sideband emitted from the surface emitting laser into the alkali metal cell.

According to the embodiment of the present invention, a surface emitting laser element on which plural surface emitting lasers for emitting laser light with different wavelengths are formed and in which electric characteristics or the like of the respective surface emitting lasers are uniform is provided.

BRIEF DESCRIPTION OF THE DRAWINGS

Other objects and further features of embodiments will be apparent from the following detailed description when read in conjunction with the accompanying drawings, in which:

FIG. 2 is a cross-sectional diagram illustrating an example of a surface emitting laser element according to a first embodiment;

FIG. 3 is a top view illustrating an example of the surface emitting laser element according to the first embodiment;

FIGS. 12A and 12B are explanatory diagrams illustrating an example of the surface emitting laser element according to the third embodiment;

FIGS. 13A and 13B are explanatory diagrams illustrating an example of a surface emitting laser element having a thin phase adjustment layer 221;

DESCRIPTION OF THE PREFERRED EMBODIMENTS

In the following, embodiments of the present invention will be described with reference to the accompanying drawings. Meanwhile, the same numerical symbols are assigned to the same members, and duplicate explanation is omitted.

[First Embodiment]

The inventors of the present application found as a result of study that a configuration without a wavelength adjustment layer on an electric current path in a semiconductor of a surface emitting laser can prevent a variation in electric resistance or the like from occurring for each of surface emitting lasers with different wavelengths. That is, the inventors found that a contact layer for making ohmic contact with an upper electrode is preferably provided below the wavelength adjustment layer. In this case, a region on the upper electrode that makes the ohmic contact has a so-called intracavity structure, in which the region making the ohmic contact is arranged so as to surround a light emission region.

Figure 1:
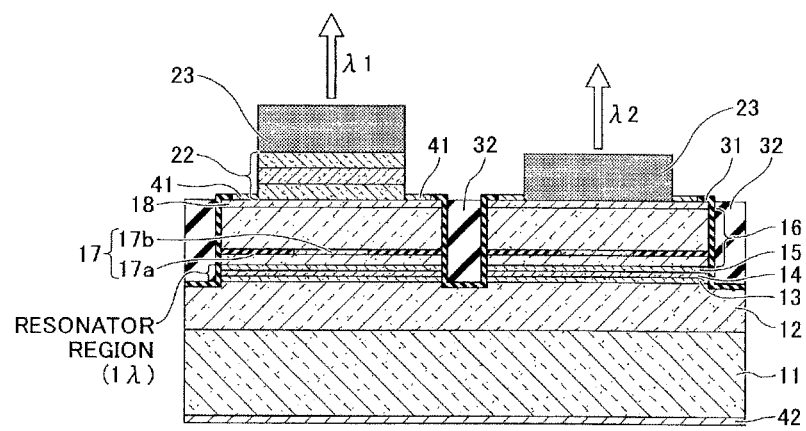
FIG. 1 is a cross-sectional diagram illustrating an example of a surface emitting laser element having a wavelength adjustment layer.

A configuration of the surface emitting laser element, as described above, is shown in FIG. 1. In the surface emitting laser element as shown in FIG. 1, on an n-GaAs (gallium arsenide) substrate 11, a lower Bragg reflection mirror 12, a lower spacer layer 13, an active layer 14, an upper space layer 15, a second upper Bragg reflection mirror 16 and a contact layer 18 are formed. On the contact layer 1B, in a region from which a laser light is emitted, a wavelength adjustment layer 22 and a first Brag reflection mirror 23 are formed. An upper electrode 41 is formed where the wavelength adjustment layer 22 is not formed. Meanwhile, in order to protect a semiconductor layer which is exposed due to a formation of a mesa, a protection layer 31 and a polyimide layer 32 are formed. On a back side of the n-GaAs substrate 11, a lower electrode 42 is formed. Moreover, in the second upper Bragg reflection mirror 16, an electric current narrowing layer 17 is formed. Surrounding area of the electric current narrowing layer 17 is selectively oxidized and a selected oxidized region 17a is formed. A region which has not been selectively oxidized is an electric current narrowing region 17b.

However, as shown in FIG. 1, in the case of forming the wavelength adjustment layer 22 on the contact layer 18 in a form of a mesa, according to a difference of a thickness of the wavelength adjustment layer 22, a difference in a confinement of light in a traverse direction occurs. The inventors of the present application have experimentally found that the surface emitting lasers formed in this way in which the thicknesses of the wavelength adjustment layer 22 are different, have different laser characteristics such as an oscillation current threshold.

Accordingly, a surface emitting laser element on which surface emitting lasers for emitting laser light with different wavelengths are formed and in which characteristics in the oscillation current threshold or the like are uniform is desired.

(Surface Emitting Laser Element)

A surface emitting laser element according to a first embodiment will be explained with reference to FIG. 2. The surface emitting laser element according to the present embodiment is a surface emitting laser element of 894.6 nm using an electric current narrowing structure which is selectively oxidized from an AlAs (aluminum arsenide) layer formed on the p-side of the n-GaAs substrate 111 which is a semiconductor substrate. In the semiconductor device according to the present embodiment, a semiconductor layer is formed by a semiconductor crystal growth on the n-GaAs substrate 111. Above and below the oscillator region, to which the wavelength adjustment region is added, an upper Bragg reflection mirror 123 formed of a dielectric material, and a lower Bragg reflection mirror 112 formed of a semiconductor material are provided, so that the oscillator region is placed between the upper Bragg reflection mirror 123 and the lower Bragg reflection mirror 112. Meanwhile, the upper Bragg reflection mirror 123 is formed by alternately laminating eight pairs of a high refraction index layer of $TiO_2$ (titanium oxide) and a low refraction index layer of $SiO_2$ (silicon dioxide).

FIG. 3 is a top view illustrating the surface emitting laser element according to the present embodiment. In the surface emitting laser element, as an example, four surface emitting lasers capable of emitting light 101, 102, 103 and 104 are formed on a chip of 300 μm square. An upper electrode 141 of the surface emitting laser 101 is connected to an electrode pad 161 and an upper electrode 141 of the surface emitting laser 102 is connected to an electrode pad 162. An upper electrode 141 of the surface emitting laser 103 is connected to an electrode pad 163 and an upper electrode 141 of the surface emitting laser 104 is connected to an electrode pad 164. The surface emitting laser element according to the present embodiment may be formed on a chip of smaller than or equal to 500 μm square (500 μm×500 μm). Meanwhile, FIG. 2 is a cross-sectional diagram obtained by cutting along a dot dashed line 3A-3B in FIG. 3.

Figure 4:
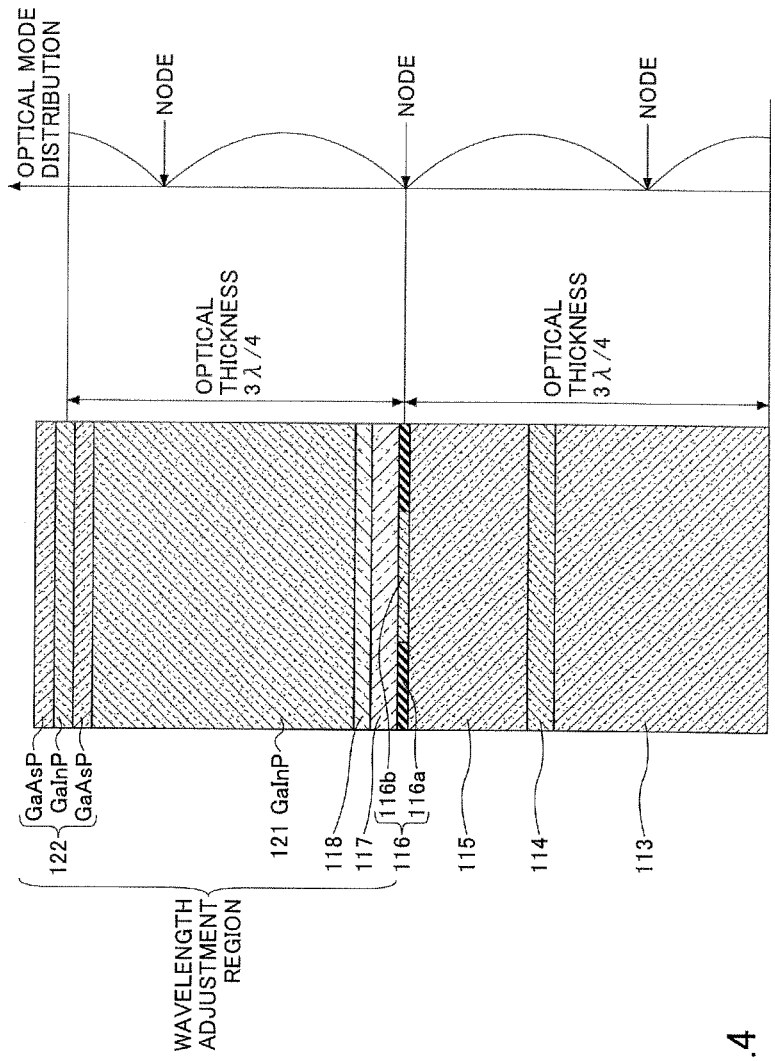
FIG. 4 is an explanatory diagram illustrating an example of the surface emitting laser element according to the first embodiment.

FIG. 4 illustrates a configuration of the oscillator region including the wavelength adjustment region in the surface emitting laser element according to the present embodiment. The wavelength adjustment region is formed by laminating in order a second phase adjustment layer 117, a contact layer 118, a first phase adjustment layer 121 and a wavelength adjustment layer 122 on an electric current narrowing layer 116. The wavelength adjustment layer 122 includes three semiconductor layers and is formed, for example, by laminating a GaAsP (gallium arsenide phosphide) layer, a GaInP (indium gallium phosphide) layer and a GaAsP layer. By making a layer number of the semiconductor layers of the wavelength adjustment layer 122 different for each of the surface emitting lasers, a total optical thickness in the wavelength adjustment region can be changed for each of the surface emitting lasers. Accordingly, in the surface emitting laser element of one chip, plural surface emitting lasers with different oscillation wavelengths, specifically, surface emitting lasers that emit laser light of four different wavelengths of λ1, λ2, λ3 and λ4, can be obtained.

In the surface emitting laser element according to the present embodiment, as shown in FIG. 2, on the n-GaAs substrate 111, the lower Bragg reflection mirror 112 is formed including 35.5 pairs of a high refraction index layer of n-$Al_{0.1}Ga_{0.9}As$ (aluminum gallium arsenide) and a low refraction index layer of n-$Al_{0.9}Ga_{0.1}As$, each layer having an optical thickness of λ/4. Above the lower Bragg reflection mirror 112, an active layer 114 including a quantum well layer of GaInAs (indium gallium arsenide) and a barrier layer of GaInPAs (indium gallium arsenide phosphide), a lower spacer layer 113 of $Al_{0.2}Ga_{0.8}As$ below the active layer 114 and an upper space layer 115 of $Al_{0.2}Ga_{0.8}As$ above the active layer 114 are formed. Above the upper spacer layer 115, the wavelength adjustment region is formed. The optical thickness of the layers including the lower spacer layer 113, the active layer 114 and the upper spacer layer is 3λ/4.

As shown in FIG. 4, in the present embodiment, the wavelength adjustment region includes the second phase adjustment layer 117, the contact layer 118, the first phase adjustment layer 121 and the wavelength adjustment layer 122. Meanwhile, the second phase adjustment layer 117 is formed of p-$Al_{0.1}Ga_{0.9}As$ having an optical thickness of 0.05λ. The contact layer 118 is formed of p$^{++}$GaAs having an optical thickness of 0.1λ. The first phase adjustment layer 121 is formed of GaInP having an optical thickness of about λ/2. The wavelength adjustment layer 122 includes three layers in total of GaAsP/GaInP/GaAsP. A thickness of a layer of the first phase adjustment layer is adjusted so that a distance from a lower end of the second phase adjustment layer 117 formed of $Al_{0.1}Ga_{0.9}As$ to a center of GaInP in the wavelength adjustment layer 122 corresponds to en optical thickness of 3λ/4. Meanwhile, each layer in the wavelength adjustment layer 122 including three layers of GaAsP/GaInP/GaAsP has an optical thickness of 0.05λ, and the wavelength adjustment layer 122 is formed so that an interval of the oscillation wavelengths of the four surface emitting lasers is 10 nm. Meanwhile, in the present embodiment, the wavelength adjustment layer 122 is formed by laminating two or more kinds of semiconductor material. In the case where the wavelength adjustment layer is formed of two kinds of semiconductor material, one of GaAsP included in the wavelength adjustment layer 122 will be called a first wavelength adjustment layer material, and the other of GaAsP will be called a second wavelength adjustment layer material in the following.

The semiconductor layer may be formed by using the MOCVD (Metal Organic Chemical Vapor Deposition) method or the MBE (Molecular Beam Epitaxy) method. The wavelength adjustment region is formed so that the layer numbers of the wavelength adjustment layers 122 are different for the respective surface emitting lasers by the selective etching by the photolithography and the wet etching, and the thicknesses of the layers are different. In the wet etching, for example, for an etchant for GaAsP (the same for GaAs) a mixed liquid of a sulfuric acid, a hydrogen peroxide and water may be used. Moreover, for an etchant for GaInP a mixed liquid of a hydrochloric acid and water may be used. Moreover, at the same time, in a part which makes contact with the upper electrode 141, the wavelength adjustment layer 122 and the first phase adjustment layer 121 are removed.

Next, as shown in FIG. 2, a mesa is formed by etching the semiconductor layer to at least a depth where a side surface of the electric current narrowing layer 116 appears. Then, the electric current narrowing layer 116 is selectively oxidized to form a selectively oxidized region 116a and an electric current narrowing region 116b. For the etching to form the mesa, a dry etching method may be used. The mesa may have an arbitrary shape, other than a circle as in the present embodiment, such as an ellipse, a square, or a rectangle. The electric current narrowing layer 116 formed of AlAs, a side surface of which is exposed by the etching process, is changed to an insulator formed of $Al_xO_y$ (aluminum oxide), by treating by heat in steam and oxidizing a surrounding area to form a selectively oxidized region 116a. Accordingly, an electric current narrowing structure, in which a path of a driving current is restricted only to the electric current narrowing region 116b in a central part which has not been oxidized and formed of AlAs, can be provided.

Next, a protection layer 131 of SiN (silicon nitride) is provided. Furthermore, the part where the semiconductor layer is etched is filled with a polyimide layer 132, and is planarized. Then, the protection layer 131 and the polyimide layer 132 on the wavelength adjustment layer 122, which has the contact layer 118 and a light emission region, or the phase adjustment layer 121 is removed. On the part that makes contact on the contact layer 118, an upper electrode 141 to be a p-side individual electrode is formed. Meanwhile, on the back side of the n-GaAs substrate 111, a lower electrode 142 to be an n-side common electrode is formed.

In the present embodiment, the surface emitting laser emits a laser light in a direction opposite to the n-GaAs substrate 111. Meanwhile, below the contact layer 118, a second phase adjustment layer 117 of $Al_{0.1}Ga_{0.9}As$ is formed. A carrier injected from the contact layer 188 flows into the electric current narrowing region 116b through the second phase adjustment layer 117. Moreover, the protection layer 131 of SiN protect with dielectric material a side surface or a bottom surface of a layer including corrosion-prone Al which has been exposed by the etching on forming the mesa, and a reliability is improved. Finally, on the wavelength adjustment layer 122 or on the first phase adjustment layer 121, a first upper Bragg reflection mirror 123 including 8.5 pairs of the high refraction index layer of $TiO_2$ and the low refraction index layer of $SiO_2$ is formed by using the electron beam evaporation method or the like.

Meanwhile, in the case where the wavelength adjustment layer directly contacts the upper electrode or the like, materials to be contacted are different for the respective surface emitting lasers, and contact resistances are different. Moreover, depending on the thickness of the wavelength adjustment region, the amounts of electric current that can be applied to the respective surface emitting lasers are different. Accordingly, the electric characteristics and the emission characteristics for the respective surface emitting lasers differ substantially. Moreover, in the case of applying a current to the wavelength adjustment region, the electric resistance increases due to the band discontinuities on interfaces between the respective layers. On the other hand, in the present embodiment, the contact layer 118 is provided in the lower part of the wavelength adjustment region, and the current injected to the surface emitting laser does not pass the upper part of the wavelength adjustment region above the contact layer 118, and the problem as described above does not occur.

Figure 5:
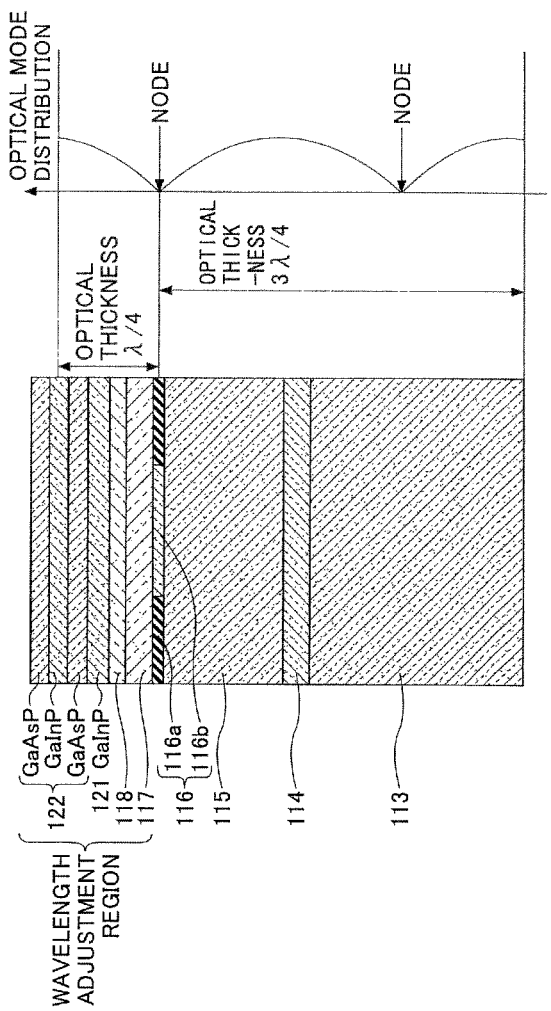
FIG. 5 is an explanatory diagram illustrating an example of a surface emitting laser element having a thin phase adjustment layer 121.

Next, a value of the optical thickness of the first phase adjustment layer 121 provided within the wavelength adjustment region will be explained. At first, as shown in FIG. 5, assume that the distance from the lower end of the second phase adjustment layer to a center of the second layer of the wavelength adjustment layer 122 corresponds to an optical thickness of $\lambda/4$. In this case, the optical thickness of each of the layers of the wavelength adjustment layer 122 is $0.05\lambda$, and the interval of the oscillation wavelengths of the four surface emitting lases is 10 nm. In order to change the optical thickness from the contact layer 118 to the center of the second layer of the wavelength adjustment layer 122 to $\lambda/4$, the optical thickness of the first phase adjustment layer is adjusted to $0.025\lambda$.

However, in the case shown in FIG. 5, the optical thickness of a part of the wavelength adjustment region above the contact layer 118 when all the three layers GaAsP/GaInP/GaAsF of the wavelength adjustment layer 122 are etched is changed from the optical thickness where the wavelength adjustment layer 122 is not etched by 86%, which is large. Accordingly, the laser characteristics for the respective surface emitting lasers, such as an oscillation threshold electric current value or a slope efficiency are widely different. In the case where the wavelength adjustment region does not have the first phase adjustment layer 121, i.e. the part of the wavelength adjustment region above the contact layer 118 includes only the three layers GaAsP/GaInP/GaAsP of the wavelength adjustment layer 122, there is not a layer that reinforces the confinement of light in a traverse direction. In this case, the laser characteristics are further different between the etched wavelength adjustment region and the non-etched wavelength adjustment region for the respective surface emitting lasers.

On the other hand, in the present embodiment, as shown in FIG. 4, the optical thickness of the first phase adjustment layer 121 is approximately $\lambda/2$, which is larger than the case shown in FIG. 5. In the present case, the optical thickness of a part of the wavelength adjustment region above the contact layer 118 when all the three layers GaAsP/GaInP/GaAsP of the wavelength adjustment layer 122 are etched is changed from the optical thickness where the wavelength adjustment layer 122 etched by 23%, which is relatively small. Accordingly, the laser characteristics for the respective surface emitting lasers, such as the oscillation threshold electric current value or the slope efficiency can be made uniform. When the optical thickness of the first phase adjustment layer 121 is increased according to a relation: approximately $N \times \lambda/2$ (N=2, 3, ... ), the change in the optical thickness of the part of the wavelength adjustment region above the contact layer 118 between the case where the wavelength adjustment layer 122 is not etched and the case where all the layers of the wavelength adjustment layer 122 are etched decreases. Accordingly, the laser characteristics for the respective surface emitting lasers, such as the oscillation threshold electric current value or the slope efficiency can be made further uniform. However, when the thickness of the first phase adjustment layer 121 increases, an adverse effect appears, e.g. an absorbed amount increases or a threshold electric current in the whole surface emitting laser increases, and the optical thickness of the first phase adjustment layer is preferably $\lambda/2$, i.e. N=1.

Meanwhile, in the present embodiment, the optical thickness of the wavelength adjustment region is given by a relation: approximately $(2N+1) \times \lambda/4$ (N=1, 2, ... ). Moreover, in the present embodiment, in a part of the oscillator which is regarded to have a high refraction index the wavelength adjustment region is formed. The refraction indices of the materials used in the wavelength adjustment region such as the contact layer 118 and GaAs or the like are close to the refraction index of the high refraction index material of $Al_{0.1}Ga_{0.9}As$ rather than the low refraction index material of $Al_{0.9}Ga_{0.1}As$, i.e. the entire layer of the wavelength adjustment region functions as a high refraction index layer. A layer configuration of the wavelength adjustment region, in which the optical thickness of the first phase adjustment layer 121 is set to approximately $\lambda/2$ or the like is the same even if the optical thickness of the oscillator region is set to $(1+N/2) \times \lambda$, (N=0, 1, 2 ... ). On the other hand, even in the case where the oscillator region is formed of the low refraction index material, and the optical thickness is given by a relation: $(1+N) \times \lambda/2$ (N=0, 1, 2, ... ), the surface emitting laser has a resonant mode. Even in this case, the layer configuration of the wavelength adjustment region, in which the optical thickness of the first phase adjustment layer 121 is set to approximately $\lambda/2$ or the like, is the same.

[Second Embodiment]

Next, the surface emitting laser element according to the second embodiment will be explained with reference to FIG. 6. The surface emitting laser element according to the present embodiment is a surface emitting laser element of 894.6 nm using an electric current narrowing structure which is selectively oxidized from an AlAs layer formed on the p-side of an n-GaAs substrate 211 which is a semiconductor substrate. In an upper part of a semiconductor layer formed by a semiconductor crystal growth on the n-GaAs substrate 211, a first upper Bragg reflection mirror 223 is formed by alternately laminating seven pairs of a high refraction index layer of $TiO_2$ and a low refraction index layer of $SiO_2$. Moreover, in the present embodiment, above and below the oscillator region, an upper Bragg reflection mirror including a second upper Bragg reflection mirror 216, a wavelength adjustment region and the first upper Bragg reflection mirror 223 and a lower Bragg reflection mirror 212 formed of a semiconductor material are formed. Accordingly, the oscillator region is placed between the upper Bragg reflection mirror and the lower Bragg reflection mirror 212, Meanwhile, the second upper Bragg reflection mirror 216 is formed of a semiconductor material and the first upper Bragg reflection mirror 223 is formed of a dielectric materiel.

Figure 6:
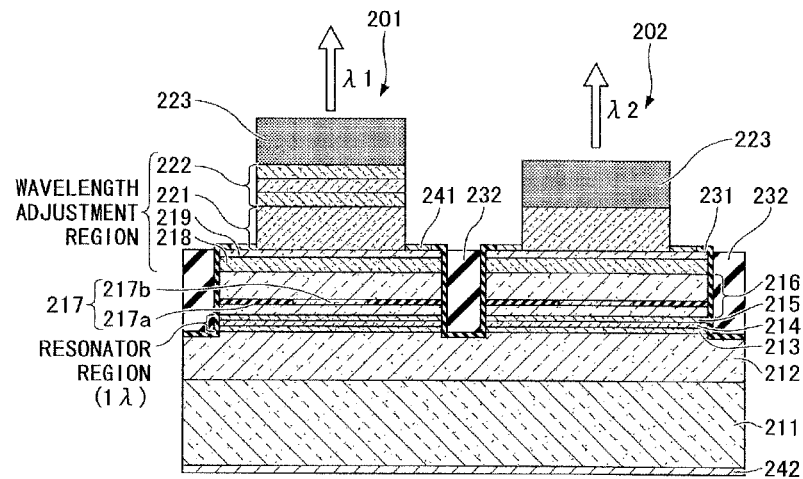
FIG. 6 is a cross-sectional diagram illustrating an example of a surface emitting laser element according to a second embodiment.
Figure 7:
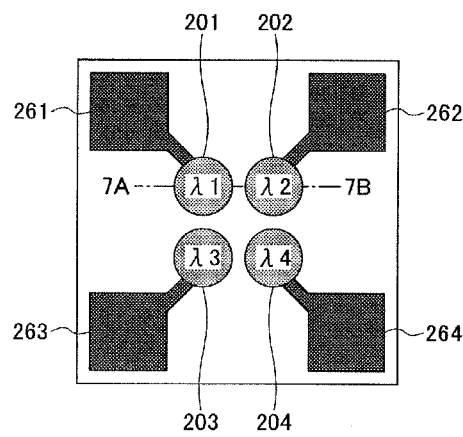
FIG. 7 is a top view illustrating an example of the surface emitting laser element according to the second embodiment.

FIG. 7 illustrates a top view of the surface emitting laser element according to the second embodiment. In the surface emitting laser element, as an example, four surface emitting lasers capable of emitting light 201, 202, 203 and 204 are formed on a chip of 300 μm square. Moreover, an upper electrode 241 of the surface emitting laser 201 is connected to an electrode pad 261, and an upper electrode 241 of the surface emitting laser 202 is connected to an electrode pad 262. An upper electrode 241 of the surface emitting laser 203 is connected to an electrode pad 263, and an upper electrode 241 of the surface emitting laser 204 is connected to an electrode pad 264. The surface emitting laser element according to the present embodiment may be formed on a chip smaller than or equal to 500 μm square (500 μm×500 μm). Meanwhile, FIG. 6 is a cross-sectional diagram obtained by cutting along a dot dashed line 7A-7B in FIG. 7.

Figure 8:
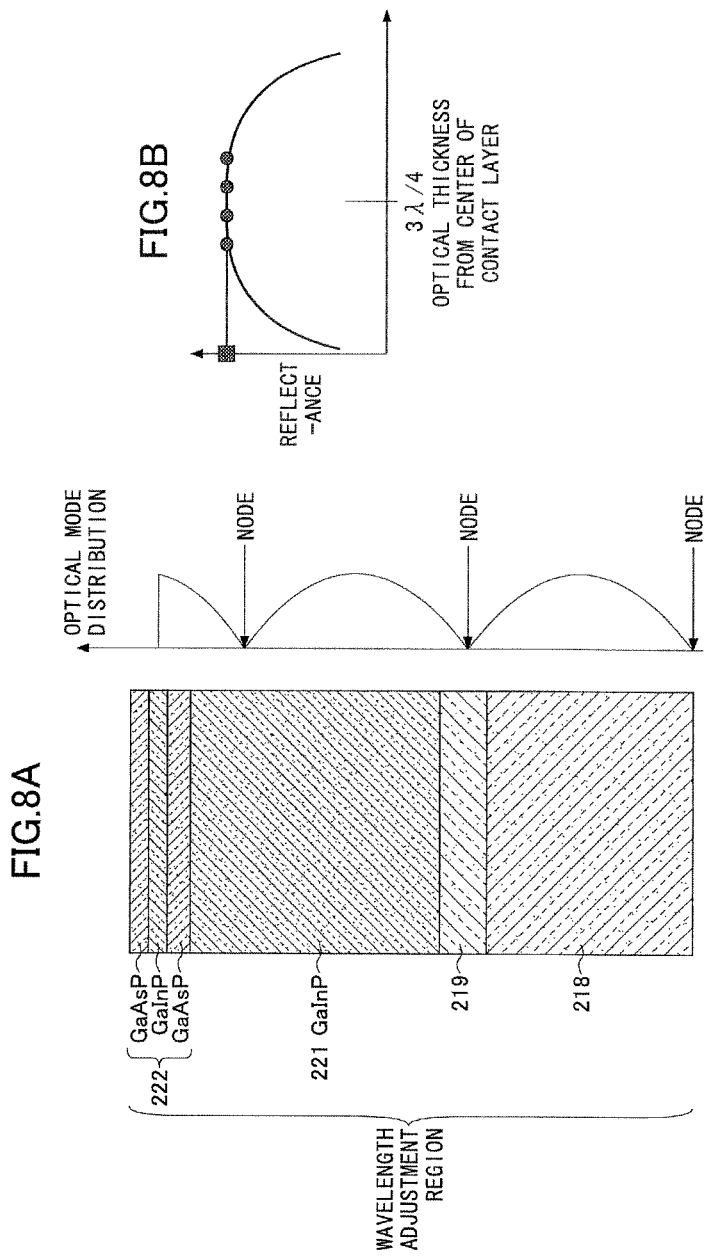
FIGS. 8A and 8B are explanatory diagrams illustrating an example of the surface emitting laser element according to the second embodiment.

FIG. 8A illustrates a configuration of the wavelength adjustment region in the surface emitting laser element according to the present embodiment. The wavelength adjustment region is formed by laminating in order a second phase adjustment layer 218, a contact layer 219, a first phase adjustment layer 221 and a wavelength adjustment layer 222 on the second upper Bragg reflection mirror 216. The wavelength adjustment layer 222 is formed by laminating three semiconductor layers, for example, a GaAsP layer, a GaInP layer and a GaAsP layer. By making a layer number of the semiconductor layers of the wavelength adjustment layers 222 different for each of the surface emitting lasers, a total optical thickness in the wavelength adjustment region can be changed for each of the surface emitting lasers. Accordingly, in the surface emitting laser element of one chip, plural surface emitting lasers with different oscillation wavelengths, specifically, surface emitting lasers that emit laser light of four different wavelengths λ1, λ2, λ3 and λ4, can be obtained.

In the surface emitting laser element according to the present embodiment, as shown in FIG. 7, on the n-GaAs substrate 211, the lower Bragg reflection mirror 212 is formed including 35.5 pairs of a high refraction index layer of n-$Al_{0.1}Ga_{0.9}As$ and a low refraction index layer of n-$Al_{0.9}Ga_{0.1}As$, each layer having an optical thickness of λ/4. Above the lower Bragg reflection mirror 212, an active layer 214 including a quantum well layer of GaInAs and a barrier layer of GaInPAs, a lower spacer layer 213 of $Al_{0.2}Ga_{0.8}As$ below the active layer 214 and an upper spacer layer 215 of $Al_{0.2}Ga_{0.8}As$ above the active layer 219 are formed. In the present embodiment, the oscillator region includes the lower spacer layer 213, the active layer 214 and the upper spacer layer 215. The optical thickness of the layers including the lower spacer layer 213, the active layer 214 and the upper spacer layer 215 is a wavelength (λ).

On the upper spacer layer 215, the second upper Bragg reflection mirror 216 including 7 pairs of a high refraction index layer of p-$Al_{0.1}Ga_{0.9}As$ and a low refraction index layer of p-$Al_{0.9}Ga_{0.1}As$ is formed. On the second upper Bragg reflection mirror 216, the wavelength adjustment region is formed. Meanwhile, in a part of the second upper Bragg reflection mirror 216, an electric current narrowing layer 217 including an AlAs layer is ed.

As shown in FIG. 8A, the wavelength adjustment region is formed including, starting from below in the laminating direction, a second phase adjustment layer 218 of p-$Al_{0.1}Ga_{0.9}As$, a contact layer 219 of $p^{++}GaAs$, a first phase adjustment layer 221 of GaInP and a wavelength adjustment layer 222. Meanwhile, the second phase adjustment layer 218 is formed of p-$Al_{0.1}Ga_{0.9}As$ having an optical thickness of approximately λ/2, and the first phase adjustment layer 221 is formed of GaInP having an optical thickness of approximately λ/2. Moreover, the contact layer 219 is located at a position of an optical thickness of approximately λ/2 from the lowermost end of the second phase adjustment layer 218, and provided at a position of a node of intensity distribution of standing wave of light.

Moreover, the wavelength adjustment layer 222 includes three layers in total of GaAsP/GaInP/GaAsP. A thickness of a layer of the first phase adjustment layer 221 is adjusted so that a distance from a center of the contact layer 219 to a center of the GaInP layer in the wavelength adjustment layer 222 corresponds to an optical thickness of 3λ/4. In this way, by adjusting the layer thickness of the first phase adjustment layer 221, as shown in FIG. 8B, reflectances of the four surface emitting lasers having different wavelengths can be made uniform.

Meanwhile, each layer wavelength adjustment layer 222 including three layers of GaAsP/GaInP/GaAsP has an optical thickness of 0.05λ, and the wavelength adjustment layer 222 is formed so that an interval of the oscillation wavelengths of the four surface emitting lasers is 2 nm. Moreover, below the contact layer 219, the second phase adjustment layer 218 of $Al_{0.1}Ga_{0.9}As$ is formed, and the layer thickness is adjusted to approximately λ/2 so that the contact layer is positioned at a node of the longitudinal mode. The above configuration of layers is found to be effective for an improvement of the laser characteristics by the inventors of the present application, since the contact layer 219 absorbs light with a wavelength of 894.6 nm.

The semiconductor layer may be formed by using the MOCVD method or the MBE method. The wavelength adjustment region is formed, so that the layer numbers of the wavelength adjustment layer 222 are made different for the respective surface emitting lasers, by photolithography and selective etching, and the thicknesses of the layers are different. In wet etching, for example, for an etchant for GaAsP (the same for GaAs) a mixed liquid of sulfuric acid, hydrogen peroxide and water may be used. Moreover, for an etchant for GaInP a mixed liquid of hydrochloric acid and water may be used. Moreover, at the same time, in a part which makes contact with the upper electrode, the wavelength adjustment layer and the first phase adjustment layer 221 are removed.

Next, as shown in FIG. 6, a mesa is formed by etching the semiconductor layer to at least a depth where a side surface of the electric current narrowing layer 217 appears. Then, the electric current narrowing layer 217 is selectively oxidized to form a selectively oxidized region 217a and an electric current narrowing region 217b. For the etching to form the mesa, a dry etching method may be used. The mesa may have an arbitrary shape, other than a circle as in the present embodiment, such as an ellipse, a square, or a rectangle. The electric current narrowing layer 217 formed of AlAs, a side surface of which is exposed by the etching process, is changed to an insulator formed of $Al_xO_y$, by heating in steam and oxidizing a surrounding area to form a selectively oxidized region 217a. Accordingly, an electric current narrowing structure, in which a path of a driving current is restricted only to the electric current narrowing region 217b in a central part which has not been oxidized and formed of AlAs, can be provided.

Next, a protection layer 231 of SiN is provided. Furthermore, the part where the semiconductor layer is etched is filled with a polyimide layer 232, and is planarized. Then, the protection layer 231 and the polyimide layer 232 on the wavelength adjustment layer 222, which has the contact layer 219 and a light emission region, or the first phase adjustment layer 221 is removed. Afterward, on the part that makes contact on the contact layer 219, an upper electrode 241 to be p-side individual electrodes is formed, and on the back side of the n-GaAs substrate 211, a lower electrode 242 to be an n-side common electrode is formed.

In the present embodiment, the surface emitting laser emits a laser light in a direction opposite the n-GaAs substrate 211. Meanwhile, the protection layer 231 of SiN protects with dielectric material a side surface or a bottom surface of a layer including corrosion-prone Al which has been exposed by the etching on forming the mesa, and the reliability is improved. Finally, on the wavelength adjustment layer 222 or on the first phase adjustment layer 221, the first upper Bragg reflection mirror 223 including 8.5 pairs of the high refraction index layer of $TiO_2$ and the low refraction index layer of $SiO_2$ is formed by using the electron beam evaporation method or the like.

Meanwhile, in the case where the wavelength adjustment layer directly contacts the upper electrode or the like, materials to be contacted are different for the respective surface emitting lasers, and contact resistances are different. Moreover, depending on the thickness of the wavelength adjustment region, the amounts of electric current that can be applied to the respective surface emitting lasers are different. Accordingly, the electric characteristics and the emission characteristics for the respective surface emitting lasers differ substantially. Moreover, in the case of applying a current to the wavelength adjustment region, the electric resistance increases due to band discontinuities on interfaces between the respective layers. On the other hand, in the present embodiment, the contact layer 219 is provided in the lower part of the wavelength adjustment region, and the current injected to the surface emitting laser does not pass the upper part of the wavelength adjustment region above the contact layer 219, and the problem as described above does not occur.

Figure 9:
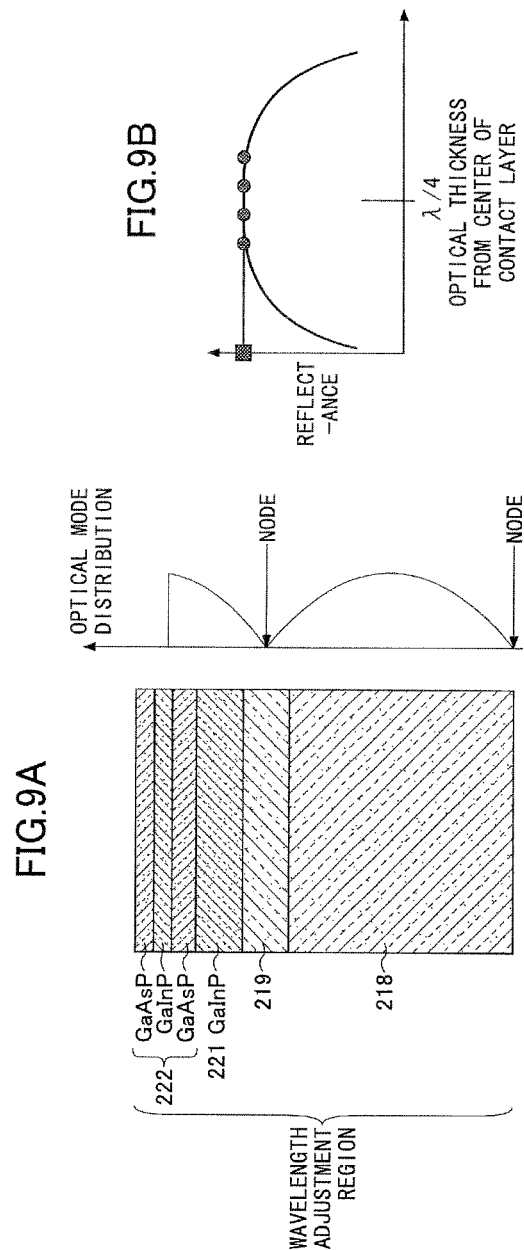
FIGS. 9A and 9B are explanatory diagrams illustrating an example of a surface emitting laser element having a thin phase adjustment layer 221.

Next, a value of the optical thickness of the first phase adjustment layer 221 provided within the wavelength adjustment region will be explained. At first, as shown in FIG. 9A, assume that the distance from a center of the contact layer 219 to a center of the GaInP layer of the wavelength adjustment layer 222 corresponds to an optical thickness of $\lambda/4$. Even in this case, the optical thickness of each of the layers of the wavelength adjustment layer 222 is $0.05\lambda$, and the interval of the oscillation wavelengths of the four surface emitting lasers is 2 nm. In order to change the optical thickness from the contact layer 219 to the center of the GaInP layer of the wavelength adjustment layer 222 to $\lambda/4$ so that reflectances of the four surface emitting lasers having different wavelengths are uniform, as shown in FIG. 8B, the optical thickness of the second phase adjustment layer 221 is adjusted to $0.05\lambda$.

However, in the case shown in FIG. 9A, the optical thickness of a part of the wavelength adjustment region above the contact layer 219 when all three layers GaAsP/GaInP/GaAsP of the wavelength adjustment layer 222 are etched is changed from the optical thickness where the wavelength adjustment layer 222 is not etched by 75%, which is large. Accordingly, the laser characteristics for the respective surface emitting lasers, such as an oscillation threshold electric current value or a slope efficiency, are widely different. In the case where the wavelength adjustment region does not have the first phase adjustment layer 221, i.e. the part of the wavelength adjustment region above the contact layer 219 includes only the three layers GaAsP/GaInP/GaAsP of the wavelength adjustment layer 222, there is not a layer that reinforces the confinement of light in a transverse direction. In this case, the laser characteristics are further different between the etched wavelength adjustment region and the non-etched wavelength adjustment region for the respective surface emitting lasers.

On the other hand, in the present embodiment, as shown in FIG. 8A, the optical thickness of the first phase adjustment layer 221 is approximately $\lambda/2$, which is larger than the case shown in FIG. 9A. In the present case, the optical thickness of a part of the wavelength adjustment region above the contact layer 219 when all three layers GaAsP/GaInP/GaAsP of the wavelength adjustment layer 222 are etched is changed from the optical thickness where the wavelength adjustment layer 222 is not etched by 23%, which is relatively small. Accordingly, the laser characteristics for the respective surface emitting lasers, such as the oscillation threshold electric current value or the slope efficiency, can be made uniform.

When the optical thickness of the first phase adjustment layer 221 is increased according to a relation: approximately $N\times\lambda/2$ (N=2, 3, ...), the change in the optical thickness of the part of the wavelength adjustment region above the contact layer 219 between the case where the wavelength adjustment layer 222 is not etched and the case where all the layers of the wavelength adjustment layer 222 are etched decreases. Accordingly, the laser characteristics for the respective surface emitting lasers can be made further uniform. However, when the thickness of the first phase adjustment layer 221 increases, an adverse effect appears, e.g. an absorbed amount increases or a threshold electric current in the whole surface emitting laser increases, and the optical thickness of the first phase adjustment layer is preferably $\lambda/2$, i.e. N=1. Moreover, regarding the second phase adjustment layer 218, when the optical thickness is increased according to the relation: approximately $N\times\lambda/2$ (N=2, 3, ...), due to the influence of the light absorption, an adverse effect appears such as the increase of a threshold electric current in the whole surface emitting laser, and the optical thickness of the second phase adjustment layer is preferably $\lambda/2$ i.e. N=1. Meanwhile, in the present embodiment, the optical thickness of the wavelength adjustment region is given by a relation: approximately $(2N+1)\times\lambda/4$ (N=1, 2, ...).

[Third Embodiment]

Next, the surface emitting laser element according to the third embodiment will be explained with reference to FIG. 10. The surface emitting laser element according to the present embodiment is a surface emitting laser element of 894.6 nm using an electric current narrowing structure which is selectively oxidized from an AlAs layer formed on the p-side of the n-GaAs substrate 211. In an upper part of a semiconductor layer, a first upper Bragg reflection mirror 223 is formed by alternately laminating seven pairs of a high refraction index layer of $TiO_2$ and a low refraction index layer of $SiO_2$. Moreover, in the present embodiment, above and below the oscillator region, an upper Bragg reflection including a second upper Bragg reflection 216, a wavelength adjustment region and the first upper Bragg reflection mirror 223 and a lower.

Bragg reflection mirror 212 formed of a semiconductor material are formed. Accordingly, the oscillator region is placed between the upper Bragg reflection mirror and the lower Bragg reflection mirror 212. Meanwhile, the second upper Bragg reflection mirror 216 is formed of a semiconductor material and the first upper Bragg reflection mirror 223 is formed of a dielectric material.

Figure 10:
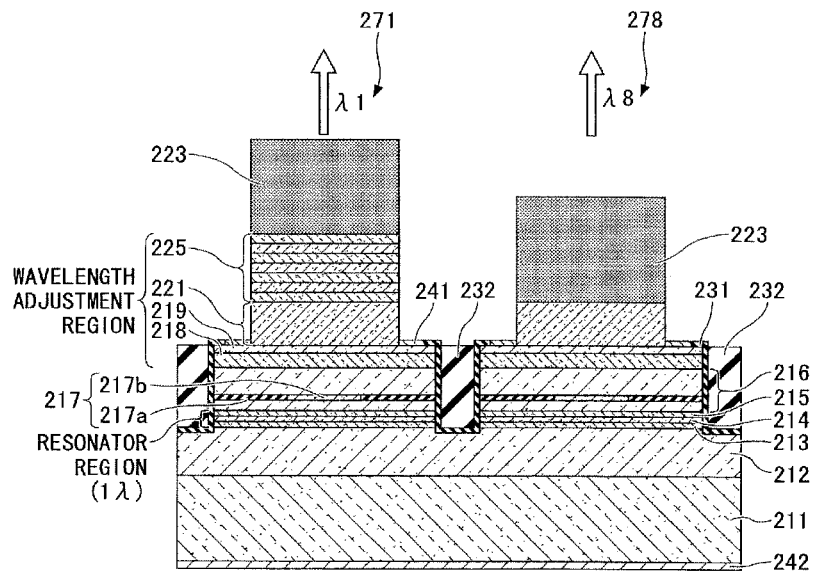
FIG. 10 is a cross-sectional diagram illustrating an example of a surface emitting laser element according to a third embodiment.
Figure 11:
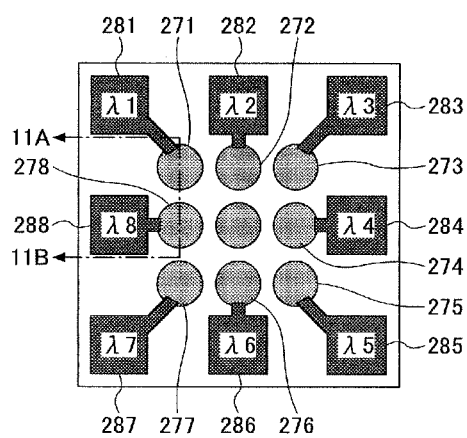
FIG. 11 is a top view illustrating an example of the surface emitting laser element according to the third embodiment.

FIG. 11 illustrates a top view of the surface emitting laser element according to the third embodiment. In the surface emitting laser element, as an example, eight surface emitting lasers capable of emitting light 271, 272, 273, 274, 275, 276, 277 and 278 are formed on a chip of 300 μm square. Moreover, an upper electrode 241 of the surface emitting laser 271 is connected to an electrode pad 281, and an upper electrode 241 of the surface emitting laser 272 is connected to an electrode pad 282. An upper electrode 241 of the surface emitting laser 273 is connected to an electrode pad 283, and an upper electrode 241 of the surface emitting laser 274 is connected to an electrode pad 284. An upper electrode 241 of the surface emitting laser 275 is connected to an electrode pad 285, and an upper electrode 241 of the surface emitting laser 276 is connected to an electrode pad 286. An upper electrode 241 of the surface emitting laser 277 is connected to an electrode pad 287, and an upper electrode 241 of the surface emitting laser 278 is connected to an electrode pad 288. Meanwhile, FIG. 10 is a cross-sectional diagram obtained by cutting along a dot dashed line 11A-11B in FIG. 11.

FIG. 12A illustrates a configuration of the wavelength adjustment region in the surface emitting laser element according to the present embodiment. The wavelength adjustment region is formed by laminating in order of a second phase adjustment layer 218, a contact layer 219, a first phase adjustment layer 221 and a wavelength adjustment layer 225 on a second upper Bragg reflection mirror 216. The wavelength adjustment layer 225 is formed by alternately laminating seven semiconductor layers, for example, GaAsP layers and GaInP layers. By making a layer number of the semiconductor layers of the wavelength adjustment layers 225 different for each of the surface emitting lasers, a total optical thickness in the wavelength adjustment region can be changed for each of the surface emitting lasers. Accordingly, in the surface emitting laser element of one chip, plural surface emitting lasers with different oscillation wavelengths, specifically, surface emitting lasers that emit laser light of eight different wavelengths of $\lambda 1, \lambda 2, \lambda 3, \lambda 4, \lambda 5, \lambda 6, \lambda 7$ and $\lambda 8$ can be obtained.

In the surface emitting laser element according to the present embodiment, as shown in FIG. 10, on the n-GaAs substrate 211, the lower Bragg reflection mirror 212 is formed including 35.5 pairs of a high refraction index layer of n-$Al_{0.1}Ga_{0.9}As$ and a low refraction index layer of n-$Al_{0.9}Ga_{0.1}As$, each layer having an optical thickness of $\lambda/4$. Above the lower Bragg reflection mirror 212, an active layer 214 including a quantum well layer of GaInAs and a barrier layer of GaInPAs, a lower spacer layer 212 of $Al_{0.2}Ga_{0.8}As$ below the active layer 214 and an upper space layer 215 of $Al_{0.2}Ga_{0.8}As$ above the active layer 214 are formed. In the present embodiment, the oscillator region includes the lower space layer 213, the active layer 214 and the upper spacer layer 215. The optical thickness of the layers including the lower spacer layer 213, the active layer 214 and the upper spacer layer 215 is a wavelength ($\lambda$).

On the upper spacer layer 215, a second upper Bragg reflection mirror 216 including 7 pairs of a high refraction index layer of p-$Al_{0.1}Ga_{0.9}As$ and a low refraction index layer of p-$Al_{0.9}Ga_{0.1}As$ is formed. On the second upper Bragg reflection mirror 216, the wavelength adjustment region is formed. Meanwhile, in a part of the second upper Bragg reflection mirror 216, an electric current narrowing layer 217 including an AlAs layer is formed.

As shown in FIG. 12A, the wavelength adjustment region is formed including a second phase adjustment layer 218 of p-$Al_{0.1}Ga_{0.9}As$, a contact layer 219 of $p^{++}GaAs$, a first phase adjustment layer 221 and a wavelength adjustment layer 225. The first phase adjustment layer 221 is formed of GaInP having an optical thickness of approximately $\lambda/2$. The wavelength adjustment layer 225 is formed by laminating seven layers in total of GaAsP/GaInP/GaAsP/GaInP/GaAsP/GaInP/GaAsP.

A thickness of a layer of the first phase adjustment layer 221 is adjusted so that a distance from a center of the contact layer 219 to a center of the fourth layer (GaInP) from the top in the wavelength adjustment layer 225 corresponds to an optical thickness of $3\lambda/4$. Accordingly, by adjusting the layer thickness of the first phase adjustment layer 221, as shown in FIG. 12B, reflectances of the eight surface emitting lasers having different wavelengths can be made largely uniform.

Meanwhile, each layer in the wavelength adjustment layer 225 including seven layers has an optical thickness of $0.05\lambda$, and the wavelength adjustment layer 225 is formed so that an interval of the oscillation wavelengths of the eight surface emitting lasers is 2 nm. Moreover, below the contact layer 219, the second phase adjustment layer 218 of $Al_{0.1}Ga_{0.9}As$ is formed, and the layer thickness is adjusted to approximately $\lambda/2$ so that the contact layer is positioned at a node of the longitudinal mode. The above configuration of layers is found to be effective for an improvement of the laser characteristics by the inventors of the present application, since the contact layer 219 absorbs light with a wavelength of 894.6 nm.

The semiconductor layer may be formed by using the MOCVD method or the MBE method. In the same way as in the first embodiment, the wavelength adjustment region is formed so that the layer numbers of the wavelength adjustment layers are made different for the respective surface emitting lasers by photolithography and selective etching, and the thicknesses of the layers are different. In wet etching, for example, for an etchant for GaAsF (the same for GaAs) a mixed liquid of sulfuric acid, hydrogen peroxide and water may be used. Moreover, for an etchant for GaInP a mixed liquid of hydrochloric acid and water may be used. Moreover, at the same time, in a part which makes a contact with the upper electrode, the wavelength adjustment region is removed.

Next, as shown in FIG. 10, a mesa is formed by etching the semiconductor layer to at least a depth where a side surface of the electric current narrowing layer 217 appears. Then, the electric current narrowing layer 217 is selectively oxidized to form a selectively oxidized region 217a and an electric current narrowing region 217b. For the etching to form the mesa, a dry etching method may be used. The mesa may have an arbitrary shape, other than a circle as in the present embodiment, such as an ellipse, a square, or a rectangle. The electric current narrowing layer 217 formed of AlAs, a side surface of which is exposed by the etching process, is changed to an insulator formed of $Al_xO_y$, by treating with steam heat and oxidizing a surrounding area to form a selectively oxidized region 217a. Accordingly, an electric current narrowing structure, in which a path of a driving current is restricted only to the electric current narrowing region 217b in a central part which has not been oxidized and formed of AlAs, can be provided.

Next, a protection layer 231 of SiN is provided. Furthermore, the part where the semiconductor layer is etched is filled with a polyimide layer 232, and is planarized. Then, the protection layer 231 and the polyimide layer 232 on the wavelength adjustment layer 225, which has the contact layer 219 and a light emission region, or the first phase adjustment layer 221, is removed. Afterward, on the part that makes contact on the contact layer 219, an upper electrode 241 to be p-side individual electrodes is formed, and on the back side of the n-GaAs substrate 211, a lower electrode 242 to be an n-side common electrode is formed.

In the present embodiment, the surface emitting laser emits a laser light in a direction opposite to the n-GaAs substrate 211. Meanwhile, the protection layer 231 of SiN protects with dielectric material a side surface or a bottom surface of a layer including corrosion-prone Al which has been exposed by the etching on forming the mesa, and the reliability is improved. Finally, on the wavelength adjustment layer 225 or on the first phase adjustment layer 221, a first upper Bragg reflection mirror 223 including 8.5 pairs of the high refraction index layer of $TiO_2$ and the low refraction index layer of $SiO_2$ is formed by using the electron beam evaporation method or the like.

Meanwhile, in the case where the wavelength adjustment layer directly contacts the upper electrode or the like, materials to be contacted are different for the respective surface emitting lasers, and contact resistances are different. Moreover, depending on the thickness of the wavelength adjustment region, the amounts of electric current that can be applied to the respective surface emitting lasers are different. Accordingly, the electric characteristics and the emission characteristics for the respective surface emitting lasers differ substantially. Moreover, in the case of applying a current to the wavelength adjustment region, the electric resistance increases due to the band discontinuities on interfaces between the respective layers. On the other hand, in the present embodiment, the contact layer 219 is provided in the lower part of the wavelength adjustment region, and the current injected to the surface emitting laser does not pass the upper part of the wavelength adjustment region above the contact layer 219, and the problem as described above does not occur.

In the present embodiment, the first phase adjustment layer 221 is effective for increasing the number of wavelengths. FIG. 13A illustrates the wavelength adjustment region in the case where a distance from the contact layer 219 to a center of the fourth layer from the top (GaInP) in the wavelength adjustment layer 225 is only $\lambda/4$. FIG. 13B illustrates a relation between the optical thickness from the center of the contact layer 219 and a reflectance, i.e. reflectances of the eight surface emitting lasers with different wavelengths. In this case, the optical thickness of the first phase adjustment layer is only $0.025\lambda$, and the optical thickness of a part of the wavelength adjustment region above the contact layer 219 when all the layers of the wavelength adjustment layer 225 are etched is changed from the optical thickness where the wavelength adjustment layer 225 is not etched by 93%, which is quite large. Accordingly, the laser characteristics for the respective surface emitting lasers, such as an oscillation threshold electric current value or the slope efficiency are further different, compared with the case in the second embodiment.

In the present embodiment, as shown in FIG. 12A, the optical thickness of the first phase adjustment layer 221 is approximately $\lambda/2$ so that a distance from a center of the contact layer 219 to a center of the fourth layer (GaInP) from the top in the wavelength adjustment layer 225 corresponds to an optical thickness of $3\lambda/4$. In the present case, the optical thickness of a part of the wavelength adjustment region above the contact layer 219 when all the layers of the wavelength adjustment layer 225 are etched is changed from the optical thickness where the wavelength adjustment layer 225 is not etched by 41%, which is relatively small. Accordingly, the laser characteristics for the respective surface emitting lasers, such as the oscillation threshold electric current value or the slope efficiency, can be made largely uniform.

Accordingly, the present embodiment has a feature that the number of surface emitting lasers, whose laser characteristics are uniform and wavelengths are different, can be increased. Meanwhile, when the optical thickness of the first phase adjustment layer 221 is increased according to a relation: approximately $N\times\lambda/2$ (N=2, 3, ...), the change in the optical thickness of the part of the wavelength adjustment region above the contact layer 219 between the case where the wavelength adjustment layer 225 is not etched and the case where all the layers of the wavelength adjustment layer 225 are etched, decreases. Accordingly, the laser characteristics for the respective surface emitting lasers can be made further uniform. However, when the thickness of the first phase adjustment layer 121 increases, an adverse effect appears, e.g. an absorbed amount increases or a threshold electric current in the whole surface emitting laser increases, and the optical thickness of the first phase adjustment layer is preferably $\lambda/2$, i.e. N=1. Meanwhile, in the present embodiment, the optical thickness of the wavelength adjustment region is given by a relation: approximately $(2N+1)\times\lambda/4$ (N=1, 2, ...).

Meanwhile, other properties in the present embodiment are the same as in the second embodiment.

[Fourth Embodiment]

Figure 14:
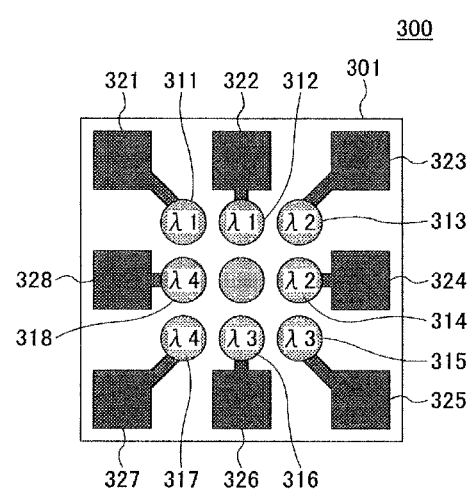
FIG. 14 is a top view illustrating an example of a surface emitting laser element according to a fourth embodiment.

Next, the surface emitting laser element according to the fourth embodiment will be explained with reference to FIG. 14. The surface emitting laser element according to the present embodiment is a surface emitting laser element of 894.6 nm using an electric current narrowing structure which is selectively oxidized from an AlAs layer. In the surface emitting laser element according to the present embodiment, as shown in FIG. 14, eight surface emitting lasers capable of emitting light are formed on a chip of 300 µm square, which emit laser light with four different wavelengths, including two surface emitting lasers for each of the wavelengths. That is, eight surface emitting lasers capable of emitting light 311, 312, 313, 314, 315, 316, 317 and 318 are formed on a chip of 300 µm square. In the present embodiment, the surface emitting lasers 311 and 312 emit laser light of wavelength of $\lambda 1$. The surface emitting lasers 313 and 314 emit laser light of wavelength of $\lambda 2$. The surface emitting lasers 315 and 316 emit laser light of wavelength of $\lambda 3$. The surface emitting lasers 317 and 318 emit laser light of wavelength of $\lambda 4$. Moreover, an upper electrode of the surface emitting laser 311 is connected to an electrode pad 321, and an upper electrode of the surface emitting laser 312 is connected to an electrode pad 322. An upper electrode of the surface emitting laser 313 is connected to an electrode pad 323, and an upper electrode of the surface emitting laser 314 is connected to an electrode pad 324. An upper electrode of the surface emitting laser 315 is connected to an electrode pad 325, and an upper electrode of the surface emitting laser 316 is connected to an electrode pad 326. An upper electrode of the surface emitting laser 317 is connected to an electrode pad 327, and an upper electrode of the surface emitting laser 318 is connected to an electrode pad 328.

In the present embodiment, two surface emitting lasers are provided for the same wavelength, and one of the surface emitting lasers can be used as a backup surface emitting laser. Since with two surface emitting lasers, which emit laser light of the same wavelength, even if one of the surface emitting lasers emitting laser light of the same wavelength becomes unable to emit light due to a failure or a defect, the other surface emitting laser can be used. Accordingly, the service life can be made longer and the yield ratio can be improved.

[Fifth Embodiment]

Next, the surface emitting laser element according to the fifth embodiment will be explained with reference to FIG. 15. The surface emitting laser element according to the present embodiment is a surface emitting laser element of 894.6 nm using an electric current narrowing structure which is selectively oxidized from an AlAs layer formed on the p-side of the n-GaAs substrate 211. In an upper part of a semiconductor layer formed by a semiconductor crystal growth on the n-GaAs substrate 211, a first upper Bragg reflection mirror 353 is formed by alternately laminating seven pairs of a high refraction index layer of $TiO_2$ and a low refraction index layer of $SiO_2$.

In the present embodiment, above and below the oscillator region, an upper Bragg reflection mirror including a second upper Bragg reflection mirror 216, a wavelength adjustment region and the first upper Bragg reflection mirror 353 and a lower Bragg reflection mirror 212 formed of a semiconductor material are formed. Accordingly, the oscillator region is placed between the upper Bragg reflection mirror and the lower Bragg reflection mirror 212. Meanwhile, the wavelength adjustment region is formed by laminating a second phase adjustment layer 218, a first phase adjustment layer 341 and a wavelength adjustment layer 342 on the second upper Bragg reflection mirror 216. On the wavelength adjustment layer 342 in the wavelength adjustment region a contact layer 342 is formed. On the contact layer 342 an upper electrode 361 is formed. The second upper Bragg reflection mirror 216 is formed of a semiconductor material, and the first upper Bragg reflection mirror 353 is formed of a dielectric material.

Figure 15:
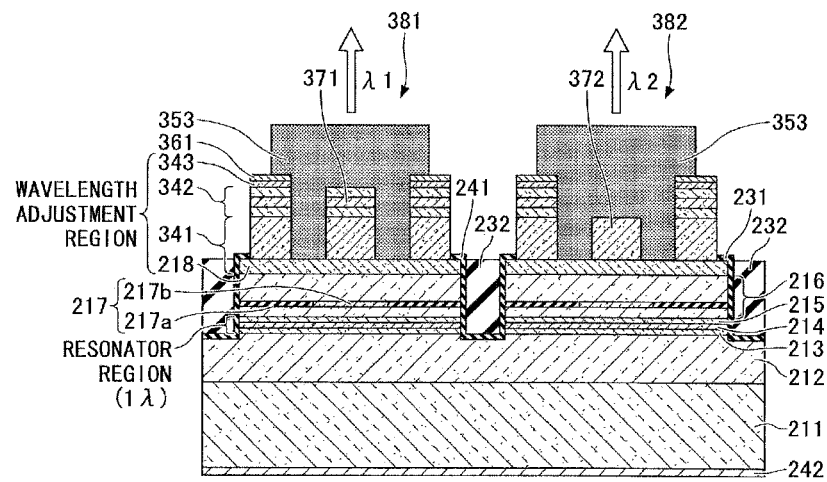
FIG. 15 is a cross-sectional diagram illustrating a first example of a surface emitting laser element according to a fifth embodiment.
Figure 16:
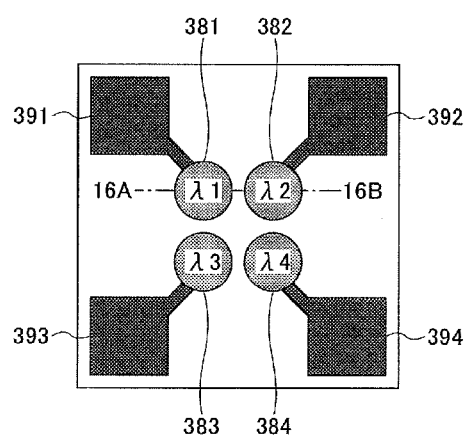
FIG. 16 is a top view illustrating an example of the surface emitting laser element according to the fifth embodiment.

FIG. 16 illustrates a top view of the surface emitting laser element according to the present embodiment. In the surface emitting laser element, as an example, four surface emitting lasers capable of emitting light 381, 382, 383 and 384 are formed on a chip of 300 μm square. Moreover, an upper electrode 361 of the surface emitting laser 381 is connected to an electrode pad 391, and an upper electrode 361 of the surface emitting laser 382 is connected to an electrode pad 392. An upper electrode 361 of the surface emitting laser 383 is connected to an electrode pad 393, and an upper electrode 361 of the surface emitting laser 384 is connected to an electrode pad 394. The surface emitting laser element according to the present embodiment may be formed on a chip of smaller than or equal to 500 μm square (500 μm×500 μm). Meanwhile, FIG. 15 is a cross sectional diagram on a cross section obtained by cutting along a dot dashed line 16A-16B in FIG. 16.

Figure 17:
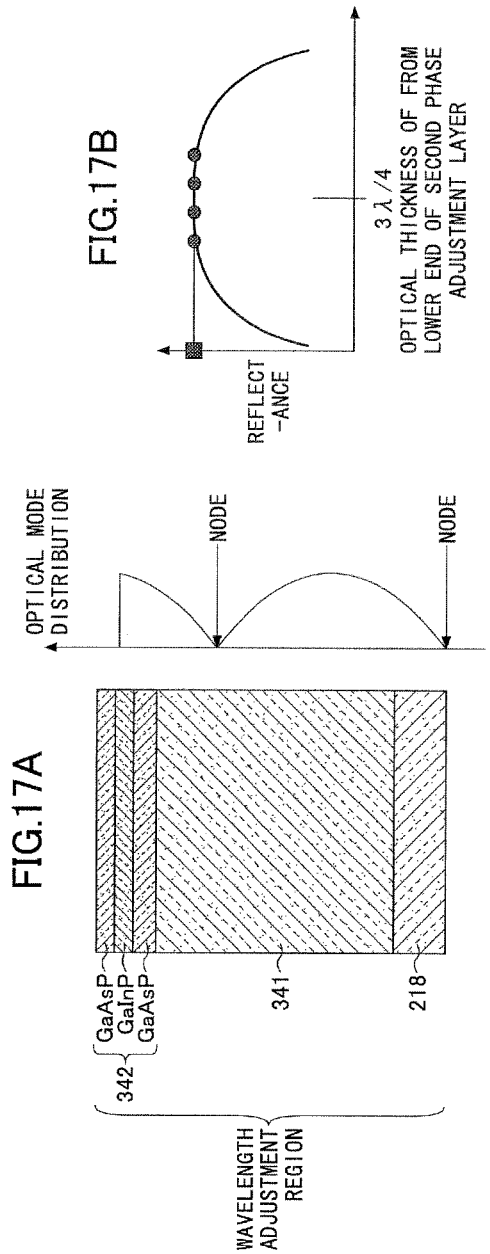
FIGS. 17A and 17B are explanatory diagrams illustrating a first example of the surface emitting laser element according to the fifth embodiment.

FIGS. 17A and 17B illustrate a configuration of the wavelength adjustment region in the surface emitting laser element according to the present embodiment. Specifically, FIG. 17A illustrates the wavelength adjustment region in the case where a distance from the lower end of the second phase adjustment layer 218 to a center of the p-GaInP layer in the wavelength adjustment layer 342 corresponds to an optical thickness of $3\lambda/4$. Moreover, FIG. 17B shows a relation between an optical thickness from the lower end of the second phase adjustment layer 218 and a reflectance, i.e. reflectances of the four surface emitting lasers with different wavelengths.

As described above, the wavelength adjustment region is formed on the second upper Bragg reflection mirror 216 by laminating the second phase adjustment layer 218, the first phase adjustment layer 341 and the wavelength adjustment layer 342, in this order. The wavelength adjustment layer 342 includes three semiconductor layers and is formed by laminating, for example, a GaAsP layer, a GaInP layer and a GaAsP layer. By making a layer number of the semiconductor layers of the wavelength adjustment layers 342 different for each of the surface emitting lasers, a total optical thickness in the wavelength adjustment region can be changed for each of the surface emitting lasers. Accordingly, in the surface emitting laser element of one chip, plural surface emitting lasers with different oscillation wavelengths, specifically, surface emitting lasers that emit laser light of four different wavelengths of $\lambda 1$, $\lambda 2$, $\lambda 3$ and $\lambda 4$, can be obtained.

The surface emitting laser element according to the present embodiment will be explained in detail with reference to FIG. 15. In the surface emitting laser element according to the present embodiment, on the n-GaAs substrate 211, the lower Bragg reflection mirror 212 is formed including 35.5 pairs of a high refraction index layer of n-$Al_{0.1}Ga_{0.9}As$ and a low refraction index layer of n-$Al_{0.9}Ga_{0.1}As$, each layer having an optical thickness of $\lambda/4$. Above the lower Bragg reflection mirror 212, a lower spacer layer 213 of $Al_{0.2}Ga_{0.8}As$, an active layer 214 including a quantum well layer of GaInAs and a barrier layer of GaInPAs and an upper space layer 215 of $Al_{0.2}Ga_{0.8}As$ are formed in this order. In the present embodiment, the oscillator region includes the lower space layer 213, the active layer 214 and the upper spacer layer 215. The optical thickness of the layers including the lower spacer layer 213, the active layer 214 and the upper spacer layer 215 is a wavelength ($\lambda$).

On the upper spacer layer 215, a second upper Bragg reflection mirror 216 including 7 pairs of a high refraction index layer of p-$Al_{0.1}Ga_{0.9}As$ and a low refraction index layer of p-$Al_{0.9}Ga_{0.1}As$ is formed. On the second upper Bragg reflection mirror 216, the wavelength adjustment region is formed. Meanwhile, in a part of the second upper Bragg reflection mirror 216, an electric current narrowing layer 217 including an AlAs layer is formed.

As shown in FIG. 17A, the wavelength adjustment region is formed including, from below in the laminating direction, a second phase adjustment layer 218 of p-$Al_{0.1}Ga_{0.9}As$, a first phase adjustment layer 341 of p-GaInP and a wavelength adjustment layer 342. The wavelength adjustment layer 342 include three layers in total of p-GaAsP/p-GaInP/p-GaAsP. A lower end of the p-$Al_{0.1}Ga_{0.9}As$ which is the second phase adjustment layer 218 and an upper end of the second upper Bragg reflection mirror 216, which is located below the second phase adjustment layer 218, are connected so as to match the phase. In the present embodiment, the connection portion is a node of the mode. Thicknesses of the second phase adjustment layer 218 and the first phase adjustment layer 341 are adjusted so that a distance from the node at the lower end of the p-$Al_{0.1}Ga_{0.9}As$ layer, which is the second phase adjustment layer, to a center of the p-GaInP layer in the wavelength adjustment layer 342 corresponds to an optical thickness of $3\lambda/4$. In this way, by adjusting the layer thicknesses of the second phase adjustment layer 218 and the first phase adjustment layer 341, as shown in FIG. 17B, reflectances of the four surface emitting lasers having different wavelengths can be made uniform. Meanwhile, the optical thickness of each of the three layers in total of p-GaAsP/p-GaInP/p-GaAsP in the wavelength adjustment layer 342 is $0.06\lambda$, and the wavelength adjustment layer 342 is formed so that an interval of the oscillation wavelengths of the four surface emitting lasers is 2 nm. Meanwhile, in the present embodiment, optical thicknesses of two kinds of materials p-$Al_{0.1}Ga_{0.9}As$ and p-GaInP included in the second phase adjustment layer 218 and the first phase adjustment layer 341 are $0.03\lambda$ and $0.6\lambda$, respectively.

The semiconductor layer may be formed by using the MOCVD method or the MBE method. The wavelength adjustment region formed so that the layer numbers of the wavelength adjustment layers 342 are made different for the respective surface emitting lasers by photolithography and selective etching, and the thicknesses of the layers are different. In wet etching, for example, for an etchant for GaAsP (the same for GaAs) a mixed liquid of sulfuric acid, hydrogen peroxide and water may be used. Moreover, for an etchant for GaInP a mixed liquid of hydrochloric acid and water may be used. Moreover, at the same time, by removing a part of the wavelength adjustment layer 342 and the first phase adjustment layer 341 outside a light emission region, so that the light emission region has a form of a convex shape, as shown in FIG. 15, a convex portion 371 and a convex portion 372 of the wavelength adjustment region are formed. Meanwhile, in the case where such convex portions 371 and 372 by the wavelength adjustment region are not formed in the light emission region, an adverse effect is found to occur in transverse mode control, by influence of a shape of an electrode contact region around the light emission region, as a result of the study of the inventors of the present application. In the present embodiment, based on the result, the convex portions 371 and 372 by the wavelength adjustment region are formed. In the surface emitting laser element having the configuration shown in FIG. 15, the convex portion 371 in the light emission region is formed of the wavelength adjustment layer 342 and the first phase adjustment layer 341. The convex portion 372 in the light emission region is formed by the first phase adjustment layer 341. Moreover, in the stage where a crystal grows, a contact layer 343 is formed on the wavelength adjustment region, the contact layer 343 in the light emission region, i.e. in the convex portion 371 or the like is removed by wet etching, and the contact layer 343 in a region to be contacted around the light emission region is left.

Next, as shown in FIG. 15, a mesa is formed by etching the semiconductor layer to at least a depth where a side surface of the electric current narrowing layer 217 appears. Then, the electric current narrowing layer 217 is selectively oxidized to form a selectively oxidized region 217a and an electric current narrowing region 217b. For the etching to form the mesa, a dry etching method may be used. The mesa may have an arbitrary shape, other than a circle as in the present embodiment, such as an ellipse, a square, or a rectangle. The electric current narrowing layer 217 formed of AlAs, a side surface of which is exposed by the etching process is changed to an insulator formed of $Al_xO_y$, by treating with steam heat and oxidizing a surrounding area to form a selectively oxidized region 217a. Accordingly, an electric current narrowing structure, which a path of a driving current is restricted only to the electric current narrowing region 217b in a central part which has not been oxidized and formed of AlAs, can be provided.

Next, a protection layer 231 of SiN is provided. Furthermore, the part where the semiconductor layer is etched is filled with a polyimide layer 232, and is planarized. Then, the protection layer 231 of SiN and the polyimide layer 232 on the wavelength adjustment layer 342, which has the contact layer 343 and a light emission region, or the first phase adjustment layer 341 is removed. On the part that makes contact on the contact layer 343, an upper electrode 361 to be a p-side individual electrode is formed, and on the back side of the n-GaAs substrate 211, a lower electrode 242 to be an n-side common electrode is formed.

In the present embodiment, the surface emitting laser emits a laser light in a direction opposite to the n-GaAs substrate 211. Meanwhile, by forming a protection layer 231 of SiN, a side surface or a bottom surface of a layer including corrosion-prone Al which has been exposed by etching on forming the mesa can be protected with a dielectric material, and reliability is improved. Finally, on the wavelength adjustment layer 342 and the second phase adjustment layer 218, a first upper Bragg reflection mirror 353 including 8.5 pairs of the high refraction index layer of $TiO_2$ and the low refraction index layer of $SiO_2$ is formed by using the electron beam evaporation method or the like.

Meanwhile, in the present embodiment, the contact layer 343 is formed in the upper part of the wavelength adjustment region, and in a periphery of the light emission region the contact layer 343 and electrically-conductive wavelength adjustment region are left and connected to the upper electrode 361. On the other hand, in the light emission region, the contact layer 343 is removed, and light absorption is quite small.

Figure 18:
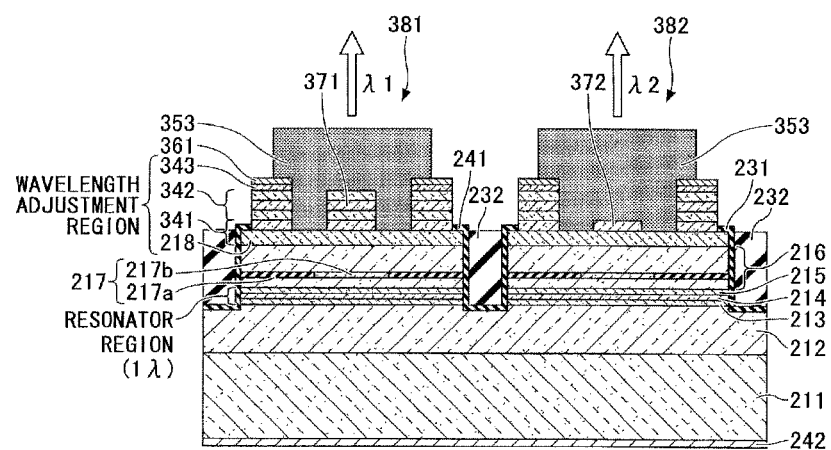
FIG. 18 is a cross-sectional diagram illustrating a second example of the surface emitting laser element according to the fifth embodiment.
Figure 19B:
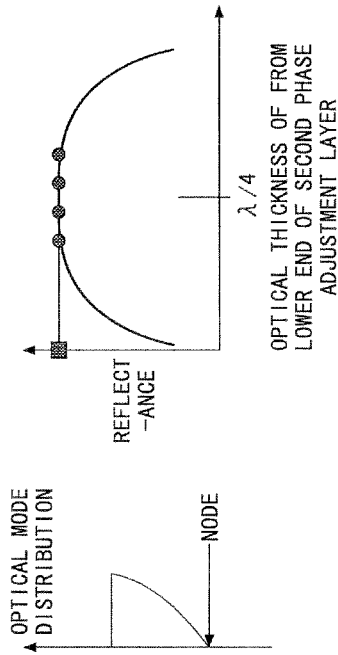
FIGS. 19A and 19B are explanatory diagrams illustrating a second example of the surface emitting laser element according to the fifth embodiment.
Figure 19A:
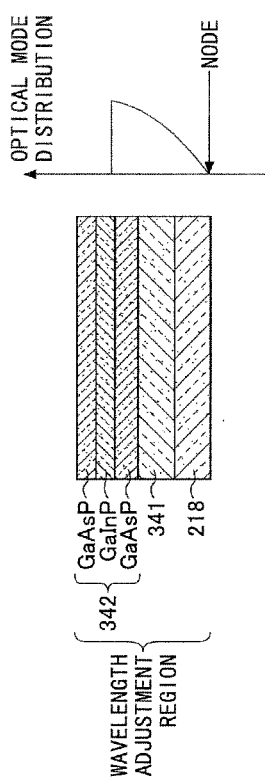

Next, values of the optical thickness of the second phase adjustment layer 218 and the first phase adjustment layer 341 provided within the wavelength adjustment region will be explained. At first, as shown in FIG. 15, assume that the distance from the lower end of the $p\text{-}Al_{0.1}Ga_{0.9}As$ layer which is the second phase adjustment layer 218 to a center of the p-GaInP layer of the wavelength adjustment layer 342 corresponds to an optical thickness of $\lambda/4$. A configuration of the surface emitting laser element in the present case is shown in FIG. 18. FIGS. 19A and 19B illustrate an enlarged view of the wavelength adjustment region in the surface emitting laser in the above configuration. Specifically, FIG. 19A illustrates the wavelength adjustment region in the case where a distance from the lower end of the second phase adjustment layer 218 to a center of the p-GaInP layer in the phase adjustment layer 342 corresponds to an optical thickness of $\lambda/4$. Moreover, FIG. 19B shows a relation between an optical thickness from the lower end of the second phase adjustment layer 218 and a reflectance, i.e. reflectances of the four surface emitting lasers with different wavelengths.

Even in this case, since the optical thickness of each layer of the wavelength adjustment layer 342 is $0.06\lambda$, and the interval of the oscillation wavelengths of the four surface emitting lasers is 2 nm, as shown in FIG. 19B, reflectances of the four surface emitting lasers having different wavelengths can be made uniform. In this way, in order to change the optical thickness from a lower end of the wavelength adjustment region to the center of the p-GaInP layer of the wavelength adjustment layer 342 to $\lambda/4$, an entire optical thickness of the second phase adjustment layer 218 and the first phase adjustment layer 341 is adjusted to $0.16\lambda$.

On this occasion, also in the surface emitting laser element, shown in FIG. 18, in the same way as in the surface emitting laser element shown in FIG. 15, convex portions 371 and 372 having convex shapes in the light emission region. Meanwhile, in the surface emitting laser element shown in FIG. 18, an optical thickness of the p-GaInP layer, which is the first phase adjustment layer 341 forming a part of the convex portions 371 and 372 in the light emission region, is $0.13\lambda$.

Incidentally, in the case as shown in FIG. 18, the optical thickness of the convex portions 371 and 372 by the wavelength adjustment region when all the three layers of p-GaAsP/p-GaInP/p-GaAsP are etched is changed from the optical thickness where the wavelength adjustment layer 342 is not etched by 58%, which is large. Accordingly, the laser characteristics for the respective surface emitting lasers, such as an oscillation threshold electric current value of slope efficiency are widely different. In the case where the wavelength adjustment region does not have the first phase adjustment layer 341, i.e. the wavelength adjustment region includes only the three layers p-GaAsP/p-GaInP/p-GaAsP of the wavelength adjustment layer 342, there is not a layer that reinforces the confinement of light in a transverse direction. In this case, the laser characteristics are further different between the etched wavelength adjustment region and the non-etched wavelength adjustment region for the respective surface emitting lasers.

On the other hand, in the surface emitting laser element, as shown in FIG. 15, the optical thickness of the second phase adjustment layer 218 and the first phase adjustment layer 391 is approximately $3\lambda/4$, as shown in FIG. 17A, which is larger than the case shown in FIG. 19A. In the present case, the optical thickness of the convex portions 371 and 372 by the wavelength adjustment region when all the three layers p-GaAsP/p-GaInP/p-GaAsP of the wavelength adjustment layer 392 are etched is changed from the optical thickness where the wavelength adjustment layer 342 is not etched by 23%, which is relatively small. Accordingly, the laser characteristics for the respective surface emitting lasers, such as the oscillation threshold electric current value or the slope efficiency can be made uniform.

When the optical thickness of the second phase adjustment layer 218 and the first phase adjustment layer 341 are increased according to a relation: approximately $N\times\lambda/2$ (N=2, 3, ...), the change in the thickness of the wavelength adjustment region between the case where the wavelength adjustment layer 342 is not etched and the case where all the layers of the wavelength adjustment layer 342 are etched decreases. Accordingly, the laser characteristics for the respective surface emitting lasers can be made further uniform. However, since an adverse effect appears, e.g. an absorbed amount increases or a threshold electric current in the whole surface emitting laser increases, the optical thickness of the second phase adjustment layer 21E and the first phase adjustment layer 341 are preferably $\lambda/2$, i.e. N=1.

Meanwhile, in the wavelength adjustment region according to the present embodiment, two kinds of layers, i.e. the second phase adjustment layer 218 of p-$Al_{0.1}Ga_{0.9}As$ and the first phase adjustment layer 341 of p-GaInP, are formed. In the present embodiment, the convex portions 371 and 372 are formed in the light emission region by the selective wet etching method or the like. However, when an end point control can be performed in terms of time or the like, the convex portions 371 and 372 may be formed, for example, only of the p-$Al_{0.1}Ga_{0.9}As$ layer which is the second phase adjustment layer 218.

[Sixth Embodiment]

Figure 20:
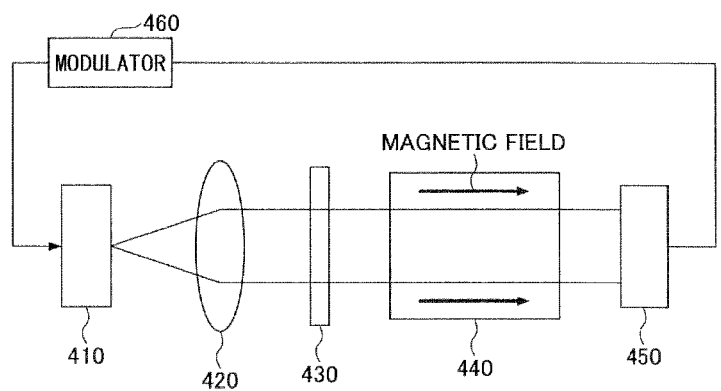
FIG. 20 is a diagram illustrating an example of a configuration of an atomic oscillator according to a sixth embodiment.

Next, the sixth embodiment will be explained. The present embodiment relates to an atomic oscillator using the surface emitting laser element according any one of the first to fifth embodiments. With reference to FIG. 20, the atomic oscillator according to the present embodiment will be explained. The atomic oscillator according to the present embodiment is a small-sized atomic oscillator of the CPT type, including a light source 410, a collimating lens 420, a quarter-wave plate 430, an alkali metal cell 440, a light detector 450 and a modulator 460 (See, for example, S. Knappe et al, Applied Physics Letters, 85 (2004) 1460 and Japanese Published Patent Application No. 2009-188598).

Meanwhile, in the atomic oscillator according to the present embodiment, by injecting lights with two different wavelengths out of lights including a side band emitted from the surface emitting laser into the alkali metal cell 440, an oscillation frequency is controlled according to a light absorption characteristic due to a quantum interference effect by two kinds of resonance lights.

For the light source 410, the surface emitting laser element is made according to any one of the first to fifth embodiments of the present invention. In the alkali metal cell 440, alkali atoms of cesium (Cs) are encapsulated, and the transition of the D1 line is used. For the light detector 450, a photodiode is used.

In the atomic oscillator according to the present embodiment, a light emitted from the light source 410 is irradiated to the alkali metal cell 440 in which the cesium atom gas is encapsulated, thereby electrons in the cesium atom are excited. Light having passed through the alkali metal cell 440 is detected by the light detector 450. A signal detected by the light detector 450 is fed back to the modulator 460. The modulator modulates the surface emitting laser element at the light source 410.

Figure 21:
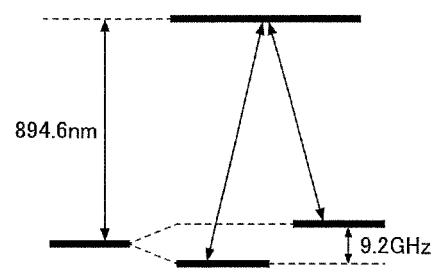
FIG. 21 is an explanatory diagram illustrating an example of atomic energy levels for explaining a CPT type atomic oscillator.
Figure 22:
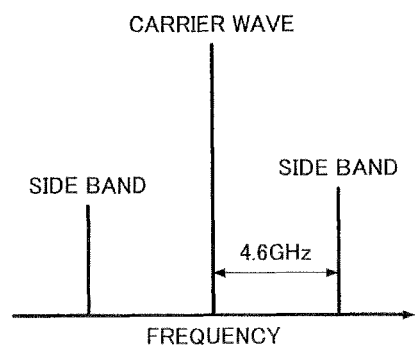
FIG. 22 is an explanatory diagram illustrating output wavelengths on a modulation of a surface emitting laser.
Figure 23:
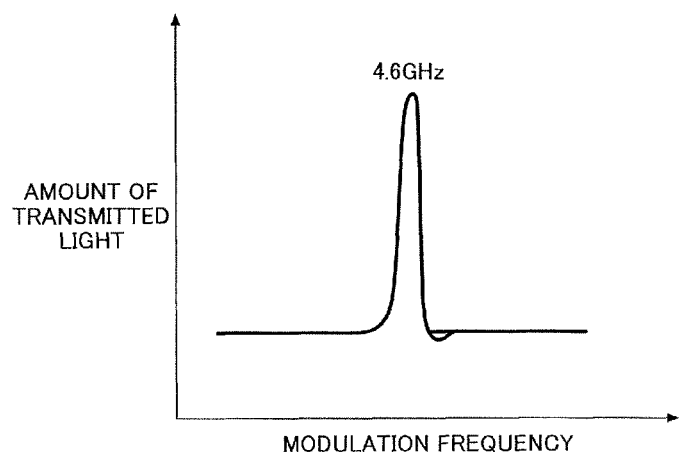
FIG. 23 is a diagram illustrating an example of a correlation between a modulation frequency and an amount of transmitted light.

FIG. 21 illustrates a structure of atomic energy level related to the CPT method, which uses a property that when electrons are simultaneously excited from two ground states to an excited state, respectively, a light absorption rate decreases. In the surface emitting laser, there is an element, a wavelength of a carrier wave of which is close to 894.6 nm. The wavelength of the carrier wave can be tuned by changing temperature or output power of the surface emitting laser. As shown in FIG. 22, side bands appear on both sides of the carrier wave by the modulation. In the present embodiment, the surface emitting laser is modulated with a frequency of 46 GHz, so that a frequency difference between the side bands corresponds to the eigen frequency of the cesium atom, i.e. 9.2 GHz. As shown in FIG. 23, the amount of laser light transmitted through the excited cesium atom gas becomes maximum value when the frequency difference between the side bands corresponds to the eigen frequency difference of the cesium atom. The signal detected at the light detector 450 is fed back at the modulator 460 so that the output power from the light detector 450 is maintained at the maximum value. Accordingly, the modulation frequency of the surface emitting laser at the light source 410 is tuned. Since the eigen frequency of the atom is stable, a value of the modulation frequency is stable. This information is extracted as an output. Meanwhile, in the case where the wavelength is 894.6 nm, a light source having a range of wavelength of light within ±1 nm is required. More preferably, a light source having a range of wavelength of light within ±0.3 nm is required (See, for example, Comprehensive Microsystems, Ed. Y. Gianchandani, O. Tabata and H. Zappe, Elsevier, 2008, Vol. 3, 571-612).

The atomic oscillator according to the present embodiment uses the surface emitting laser element according to any one of the first to fifth embodiments. For the surface emitting laser, due to the variation of layer thickness in the crystal growth, it is difficult to obtain a uniform oscillation wavelength within ±1 nm, as described above. However, by forming plural surface emitting Lasers with difference oscillation frequencies in a chip, a surface emitting laser having an oscillation wavelength close to 894.6 nm can be selected to operate. Accordingly, the yield ratio related to the oscillation wavelength can be improved, and an atomic oscillator can be produced and provided with low cost. According to the present embodiment, a desired wavelength interval can be controlled with high accuracy, the optimum wavelength interval taking account of a distribution of the variation of the oscillation wavelength due to a crystal growth can be set easily, not merely setting an equal interval. Accordingly, the yield ratio of the oscillation wavelength can be further improved. Moreover, by using the surface emitting laser element according to the fourth embodiment, a further long-life atomic oscillator can be provided.

Moreover, in the present embodiment, cesium (Cs) is used as the alkali metal and the surface emitting laser, a wavelength of which is 894.6 nm, is employed so as to use the transition of the D1 line. However, a surface emitting laser, a wavelength of which is 852.3 nm, may be employed so as to use the transition of the D2 line. Moreover, rubidium (Rd) may be used as the alkali metal. In this case, a surface emitting laser, a wavelength of which is 795.0 nm, and a surface emitting laser, a wavelength of which is 780.2 nm may be employed so as to user the transition of the D1 and D2 lines, respectively. A material composition of the active layer or the like may be designed according to the wavelength. Moreover, the modulation frequencies in the case of using rubidium are 3.4 GHz and 1.5 GHz for rubidium 87 ($^{87}$Rb) and rubidium 85 ($^{85}$Rb), respectively. Meanwhile, also for the above wavelengths, a light source having a range of wavelength of light within ±1 nm is required.

Further, the present invention is not limited to these embodiments, but various variations and modifications may be made without departing from the scope of the present invention. Moreover, in the embodiment of the present invention, the case where the surface emitting laser element is applied to the atomic oscillator is explained, but the surface emitting laser according to any one of the first to the fifth embodiments may be applied to another apparatus or the like which requires light with a predetermined wavelength, such as a gas sensor. In such a case, in these apparatuses or the like, by using the surface emitting laser light with a predetermined wavelength depending on the use, the same effect is obtained.

The present application is based on and claims the benefit of priorities of Japanese Priority Applications No. 2013-114881 filed on May 31, 2013 and No. 2014-050392 filed on Mar. 13, 2014, with the Japanese Patent Office, the entire contents of which are hereby incorporated by reference.

What is claimed is:

1. A surface emitting laser element including a plurality of surface emitting lasers provided on a substrate, each of the plurality of surface emitting lasers comprising:
a first reflection mirror provided on the substrate;
an active layer provided on the first reflection mirror;
a wavelength adjustment region provided on the active layer; and
a second reflection mirror provided on the wavelength adjustment region, wherein
the wavelength adjustment region includes a phase adjustment layer and a wavelength adjustment layer provided on the phase adjustment layer,
an optical thickness of the wavelength adjustment region is approximately a positive odd multiple of a wavelength of emitted light divided by four,
an optical thickness of the phase adjustment layer is approximately a positive even multiple of the wavelength of the emitted light divided by four, and
an optical thickness of the wavelength adjustment layer is different from a thickness of a wavelength adjustment layer of at least one of the other surface emitting lasers.

2. The surface emitting laser element as claimed in claim 1, wherein each of the plurality of surface emitting lasers further includes a contact layer having a first electrode between the active layer and the phase adjustment layer.

3. The surface emitting laser element as claimed in claim 1, wherein each of the plurality of surface emitting lasers further includes a contact layer having a first electrode on the wavelength adjustment layer and outside a light emission region.

4. The surface emitting laser element as claimed in claim 1, wherein each of the plurality of surface emitting lasers further includes a third reflection mirror between the active layer and the wavelength adjustment region.

5. The surface emitting laser element as claimed in claim 2, wherein in each of the plurality of surface emitting lasers the contact layer is located at a height of a half of the wavelength of the emitted light from a lower end of the wavelength adjustment region.

6. A surface emitting laser element including a plurality of surface emitting lasers provided on a substrate, each of the plurality of surface emitting lasers comprising:
a first reflection mirror provided on the substrate;
an active layer provided on the first reflection mirror;
a wavelength adjustment region provided on the active layer; and
a second reflection mirror provided on the wavelength adjustment region, wherein
the wavelength adjustment region includes a phase adjustment layer and a wavelength adjustment layer provided on the phase adjustment layer,
an optical thickness of the wavelength adjustment region is approximately a positive odd multiple of a wavelength of emitted light divided by four,
an optical thickness of the phase adjustment layer is approximately a positive even multiple of the wavelength of the emitted light divided by four, and
an optical thickness of the wavelength adjustment layer is different from a thickness of a wavelength adjustment layer of at least one of the other surface emitting lasers,
wherein in each of the plurality of surface emitting lasers the second reflection mirror is formed by alternately laminating dielectrics, refraction indices of the dielectrics being different from each other.

7. A surface emitting laser element including a plurality of surface emitting lasers provided on a substrate, each of the plurality of surface emitting lasers comprising:
a first reflection mirror provided on the substrate;
an active layer provided on the first reflection mirror;
a wavelength adjustment region provided on the active layer; and
a second reflection mirror provided on the wavelength adjustment region, wherein
the wavelength adjustment region includes a phase adjustment layer and a wavelength adjustment layer provided on the phase adjustment layer,
an optical thickness of the wavelength adjustment region is approximately a positive odd multiple of a wavelength of emitted light divided by four,
an optical thickness of the phase adjustment layer is approximately a positive even multiple of the wavelength of the emitted light divided by four, and
an optical thickness of the wavelength adjustment layer is different from a thickness of a wavelength adjustment layer of at least one of the other surface emitting lasers,
wherein in each of the plurality of surface emitting lasers the wavelength adjustment layer is formed by laminating a first wavelength adjustment layer material and a second wavelength adjustment layer material,
the first wavelength adjustment layer material is removed by a wet etching with a first etchant and the second wavelength adjustment layer material is removed by a wet etching with a second etchant, and
the first etchant is different from the second etchant.

8. The surface emitting laser element as claimed in claim 7, wherein the first wavelength adjustment layer material is indium gallium phosphide (GaInP) and the second wave length adjustment layer material is gallium arsenide phosphide (GaAsP) or gallium arsenide (GaAs).

9. The surface emitting laser element as claimed in claim 1, wherein the wavelengths of lights emitted from the plurality of surface emitting lasers are different from each other.

10. The surface emitting laser element as claimed in claim 1, wherein at least two of the plurality of surface emitting lasers emit lights having the same wavelength.

11. The surface emitting laser element as claimed in claim 1, wherein at least one of the plurality of surface emitting lasers emits light having a wavelength of 780.2 nm, 795.0 nm, 852.3 nm or 894.6 nm.

12. The surface emitting laser element as claimed in claim 1, wherein in each of the plurality of surface emitting lasers the active layer includes indium gallium arsenide (GaInAs).

13. The surface emitting laser element as claimed in claim 1, wherein the substrate is smaller than or equal to 500 μm square (500 μm×500 μm).

14. The surface emitting laser element as claimed in claim 2, wherein a second electrode is provided on a back side of the substrate.

15. An atomic oscillator, comprising:
the surface emitting laser element as claimed in claim 1;
an alkali metal cell that encapsulates alkali metal; and
a light detection unit that detects light transmitted through the alkali metal cell, the light being emitted from a surface emitting laser of the surface emitting laser element, wherein
an oscillation frequency is controlled according to a light absorption characteristic of a quantum interference effect for two kinds of resonant lights, by injecting lights with two different wavelengths out of lights including sideband emitted from the surface emitting laser into the alkali metal cell.

16. The atomic oscillator as claimed in claim 15, wherein the lights with two different wavelengths are lights of the sidebands emitted from the surface emitting laser.

17. The atomic oscillator as claimed in claim 15, wherein the alkali metal encapsulated in the alkali metal cell is rubidium or cesium.

* * * * *